United States Patent
Miki et al.

(10) Patent No.: US 8,669,129 B2
(45) Date of Patent: Mar. 11, 2014

(54) METHOD FOR PRODUCING GROUP III NITRIDE SEMICONDUCTOR LIGHT-EMITTING DEVICE, GROUP III NITRIDE SEMICONDUCTOR LIGHT-EMITTING DEVICE, AND LAMP

(75) Inventors: Hisayuki Miki, Chiba (JP); Yasunori Yokoyama, Ichihara (JP); Takehiko Okabe, Chiba (JP); Kenzo Hanawa, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 207 days.

(21) Appl. No.: 12/996,329

(22) PCT Filed: Jun. 3, 2009

(86) PCT No.: PCT/JP2009/060136
§ 371 (c)(1),
(2), (4) Date: Dec. 3, 2010

(87) PCT Pub. No.: WO2009/148075
PCT Pub. Date: Dec. 10, 2009

(65) Prior Publication Data
US 2011/0084307 A1   Apr. 14, 2011

(30) Foreign Application Priority Data
Jun. 4, 2008   (JP) .................. 2008-147275

(51) Int. Cl.
*H01L 21/00*   (2006.01)
*H01L 33/00*   (2010.01)

(52) U.S. Cl.
USPC 438/47; 257/103; 257/E33.025; 257/E33.027

(58) Field of Classification Search
USPC ............. 257/103, E33.025, E33.027; 438/47
See application file for complete search history.

(56) References Cited

U.S. PATENT DOCUMENTS 5,122,845 A   6/1992   Manabe et al.
(Continued)

FOREIGN PATENT DOCUMENTS

CN   1427652 A   7/2003
CN   1941408 A   4/2007
(Continued)

OTHER PUBLICATIONS

Korean Office Action (Notice of Preliminary Rejection) dated Apr. 18, 2012 for corresponding Korean Patent Application No. 10-2010-7027034.

(Continued)

*Primary Examiner* — David S Blum
(74) *Attorney, Agent, or Firm* — Sughrue Mion, PLLC

(57) ABSTRACT

One object of the present invention is to provide a method for producing a group III nitride semiconductor light-emitting device which has excellent productivity and produce a group III nitride semiconductor light-emitting device and a lamp, a method for producing a group III nitride semiconductor light-emitting device, in which a buffer layer (12) made of a group III nitride is laminated on a substrate (11), an n-type semiconductor layer (14) comprising a base layer (14a), a light-emitting layer (15), and a p-type semiconductor layer (16) are laminated on the buffer layer (12) in this order, comprising: a pretreatment step in which the substrate (11) is treated with plasma; a buffer layer formation step in which the buffer layer (12) having a composition represented by $Al_xGa_{1-x}N$ ($0 \leq x < 1$) is formed on the pretreated substrate (11) by activating with plasma and reacting at least a metal gallium raw material and a gas containing a group V element; and a base layer formation step in which the base layer (14a) is formed on the buffer layer (12).

40 Claims, 10 Drawing Sheets

(56) References Cited

U.S. PATENT DOCUMENTS

| | | | |
|---|---|---|---|
| 5,290,393 | A | 3/1994 | Nakamura |
| 6,713,789 | B1 | 3/2004 | Shibata et al. |
| 6,939,733 | B2 | 9/2005 | Shibata et al. |
| 2007/0069239 | A1 | 3/2007 | Kosaki et al. |

FOREIGN PATENT DOCUMENTS

| | | | | |
|---|---|---|---|---|
| JP | 4-297023 A | | 10/1992 | |
| JP | 3026087 B2 | | 3/2000 | |
| JP | 3440873 B2 | | 8/2003 | |
| JP | 3700492 B2 | | 9/2005 | |
| JP | 2008-098245 A | | 4/2008 | |
| JP | 2006-109084 | * | 5/2008 | ............... H01I 33/00 |
| JP | 2008-109084 A | | 5/2008 | |
| JP | 2008-124060 | * | 5/2008 | |
| JP | 2008-124060 A | | 5/2008 | |
| KR | 10-2005-0038207 A | | 4/2005 | |
| WO | 2008020599 A1 | | 2/2008 | |

OTHER PUBLICATIONS

Chinese Office Action dated Sep. 12, 2012 for corresponding Chinese Patent Application No. 200980130253.8.

Office Action ("Notice of Reasons for Rejection") dated Nov. 13, 2012 for corresponding Japanese Patent Application No. 2008-147275.

Notice of Allowance with a mailing date of Feb. 28, 2013 for corresponding Korean Patent Application No. 10-2010-7027034.

Chinese Office Action dated Apr. 2, 2013 for counterpart Chinese Patent Application No. 200980130253.8.

* cited by examiner

METHOD FOR PRODUCING GROUP III NITRIDE SEMICONDUCTOR LIGHT-EMITTING DEVICE, GROUP III NITRIDE SEMICONDUCTOR LIGHT-EMITTING DEVICE, AND LAMP

TECHNICAL FIELD

The present invention relates to a method for producing a group III nitride semiconductor light-emitting device which is suitably used in light-emitting diodes (LEDs), laser diodes (LDs), or electronic devices; a group III nitride semiconductor light-emitting device; and a lamp.

Priority is claimed on Japanese Patent Application, No. 2008-147275, filed on Jun. 4, 2008, the contents of which are incorporated herein by reference.

BACKGROUND ART

Since a group III nitride semiconductor light-emitting device has a direct transition-type energy band gap which corresponds in range from the visible wavelength to the ultraviolet wavelength, and has excellent light-emitting efficiency, it has been used as a semiconductor light-emitting device, such as LEDs or LDs.

In addition, an electronic device having a group III nitride semiconductor has superior properties to those of conventional electronic devices having a group III-V compound semiconductor.

Such a group III-V compound semiconductor is generally produced by a metalorganic chemical vapor deposition (MOCVD) method using trimethyl gallium, trimethyl aluminum, and ammonia as a raw material. The MOCVD method is a method in which a carrier gas containing vapor of a raw material is supplied to the surface of a substrate, and the raw material is decomposed on the surface of the substrate heated to grow crystal of the raw material.

In the past, wafers made of a single crystal of Group III nitride semiconductor have not been marketed. In general, the Group III nitride semiconductor is obtained by growing a group III-V compound semiconductor crystal on a single crystal wafer containing a different compound from the semiconductor crystal. Therefore, there is a large lattice mismatch between the single crystal wafer containing a different compound from the semiconductor crystal and the group III-V compound semiconductor crystal obtained by epitaxial growth. For example, when gallium nitride (GaN) is grown on a sapphire ($Al_2O_3$) substrate, there is a 16% lattice mismatch between them. When gallium nitride is grown on a SiC substrate, there is a 6% lattice mismatch between them.

In general, when there is a large lattice mismatch, it is difficult to epitaxially grow crystal on a substrate directly. Even when crystal is epitaxially grown on the substrate, the density of the crystal is decreased, together with a decrease of crystallinity.

Then, when the Group III nitride semiconductor crystal is epitaxially grown on the sapphire substrate or a SiC single crystal substrate by the MOCVD method, in general, a layer, which is called a low-temperature buffer layer, and formed of aluminum nitride (AlN) or aluminum gallium nitride (AlGaN), is laminated, and then the group III nitride semiconductor crystal is epitaxially grown on the low temperature buffer layer (For example, Patent Documents Nos. 1 and 2).

In addition, a method in which a buffer layer is formed on the substrate by the sputtering method in advance, the substrate provided with the buffer layer is introduced into the MOCVD reaction furnace, and the group III nitride semiconductor layer is formed on the buffer layer, is also suggested (Patent Document No. 3). However, since the density and crystallinity of the crystal formed on the buffer layer are decreased, it is impossible to stably laminate an excellent crystal layer.

However, when the present inventors formed the buffer layer made of the above-mentioned material on the substrate by the sputtering method, and the gallium nitride-based compound semiconductor was laminated on the substrate provided with the buffer layer according to the Patent Documents Nos. 1 and 2, there was a limitation for improving the crystallinity of the gallium nitride-based compound semiconductor.

The reasons may be because the buffer layer contains amorphous phases or polycrystal phases in Patent Documents Nos. 1 and 2.

In the lamination methods using aluminum nitride, which is laminated by the sputtering as the buffer layer, disclosed in Patent Documents Nos. 3 and 3, due to the difference in lattice mismatch between the buffer layer and the gallium nitride layer, it is not possible to improve the crystallinity.

[Patent Document No. 1] Japanese Patent (Granted) Publication No. 3026087

[Patent Document No. 2] Japanese Unexamined Patent Application, First Publication No. H4-297023

[Patent Document No. 3] Japanese Patent (Granted) Publication No. 3440873

[Patent Document No. 4] Japanese Patent (Granted) Publication No. 3700492

DISCLOSURE OF THE INVENTION

Problems to be Solved by the Invention

In consideration of the above-described problems, an object of the present invention is to provide a method for producing the group III nitride semiconductor light-emitting device which has excellent productivity and produce a group III nitride semiconductor light-emitting device having excellent light-emitting properties, in which a buffer layer is laminated on a substrate by a method capable of laminating a crystal layer having an excellent uniformity in a short time, and grows a group III nitride semiconductor having an excellent crystallinity on the buffer layer. In addition, another object of the present invention is to provide the group III nitride semiconductor light-emitting device, and a lamp comprising the group III nitride semiconductor light-emitting device.

Means for Solving the Problem

As a result of conducting diligent research to solve the problems, the present inventors found that the group III nitride semiconductor crystal can be obtained as an excellent, stable crystal by carrying out a pretreatment on a surface of the substrate in suitable conditions, exposing the surface of the substrate so as to match the crystal lattice structure between the surface of the substrate and the group III nitride compound, making a buffer layer on the substrate by activating with plasma and reacting at least metal gallium raw material and a gas containing a group V element. Thereby, the present inventors achieved the present invention.

That is, the present invention relates to the following inventions.

[1] A method for producing a group III nitride semiconductor light-emitting device, in which a buffer layer made of a group III nitride is laminated on a substrate, an n-type semiconductor layer comprising a base layer, a light-emitting layer, and a p-type semiconductor layer are laminated on the buffer layer in this order, comprising:

a pretreatment step in which the substrate is treated with plasma;

a buffer layer formation step in which the buffer layer having a composition represented by $Al_xGa_{1-x}N$ ($0 \leq x < 1$) is formed on the pretreated substrate by activating with plasma and reacting at least a metal gallium raw material and a gas containing a group V element; and a base layer formation step in which the base layer is formed on the buffer layer.

[2] A method for producing a group III nitride semiconductor light-emitting device according to [1], wherein the base layer is formed by a metalorganic chemical vapor deposition method in the base layer formation step.

[3] A method for producing a group III nitride semiconductor light-emitting device according to [1] or [2], wherein the pretreatment step is carried out by flowing a gas containing nitrogen into a chamber in a layer formation device.

[4] A method for producing a group III nitride semiconductor light-emitting device according to [3], wherein the partial pressure of the gas containing nitrogen which is flowed into the chamber is in a range of from $1 \times 10^{-2}$ Pa to 10 Pa.

[5] A method for producing a group III nitride semiconductor light-emitting device according to any one of [1] to [4], wherein the pretreatment step is carried out in a chamber, and the pressure in the chamber is in a range of from 0.1 Pa to 5 Pa.

[6] A method for producing a group III nitride semiconductor light-emitting device according to any one of [1] to [5], wherein the time for the pretreatment step is in a range of from 30 seconds to 3,600 seconds.

[7] A method for producing a group III nitride semiconductor light-emitting device according to [6], wherein the time for the pretreatment is in a range of from 60 seconds to 600 seconds.

[8] A method for producing a group III nitride semiconductor light-emitting device according to any one of [1] to [7], wherein the temperature of the substrate in the pretreatment step is in a range of from 25° C. to 1,000° C.

[9] A method for producing a group III nitride semiconductor light-emitting device according to [8], wherein the temperature of the substrate in the pretreatment step is in a range of from 300° C. to 800° C.

[10] A method for producing a group III nitride semiconductor light-emitting device according to any one of [1] to [9], wherein the pretreatment step and the buffer layer formation step are carried out in the same chamber.

[11] A method for producing a group III nitride semiconductor light-emitting device according to any one of [1] to [10], wherein the plasma treatment in the pretreatment step is sputter cleaning.

[12] A method for producing a group III nitride semiconductor light-emitting device according to [11], wherein the sputter cleaning is carried out by generating plasma using an electrical power supply having high frequency in the pretreatment step.

[13] A method for producing a group III nitride semiconductor light-emitting device according to [12], wherein the sputter cleaning is carried out by generating nitrogen plasma using an electrical power supply having high frequency in the pretreatment step.

[14] A method for producing a group III nitride semiconductor light-emitting device according to any one of [1] or [13], wherein the method further comprises a substrate processing step in which irregularity is formed on the surface of the substrate before the pretreatment step.

[15] A method for producing a group III nitride semiconductor light-emitting device according to any one of [1] to [14], wherein the buffer layer is formed so as to cover at least 90% of a main surface of the substrate in the buffer layer formation step.

[16] A method for producing a group III nitride semiconductor light-emitting device according to any one of [1] or [15], wherein the buffer layer is formed by a reactive sputtering method in the buffer layer formation step.

[17] A method for producing a group III nitride semiconductor light-emitting device according to [16], wherein the buffer layer is formed by a reactive sputtering method which flows a gas containing the group V element into a reactor in the buffer layer formation step.

[18] A method for producing a group III nitride semiconductor light-emitting device according to [16] or [17], wherein the buffer layer is formed by an RF sputtering method in the buffer layer formation step.

[19] A method for producing a group III nitride semiconductor light-emitting device according to [18], wherein the buffer layer is formed by an RF sputtering method while moving a cathode magnet in the buffer layer formation step.

[20] A method for producing a group III nitride semiconductor light-emitting device according to [16] or [17], wherein the buffer layer is formed by a DC sputtering method in the buffer layer formation step.

[21] A method for producing a group III nitride semiconductor light-emitting device according to [20], wherein the buffer layer is formed by a pulse DC sputtering method in the buffer layer formation step.

[22] A method for producing a group III nitride semiconductor light-emitting device according to any one of [1] to [21], wherein the group V element used in the buffer layer formation step is nitrogen.

[23] A method for producing a group III nitride semiconductor light-emitting device according to any one of [1] to [22], wherein the gas containing the group V element used in the buffer layer formation step is ammonia.

[24] A method for producing a group III nitride semiconductor light-emitting device according to any one of [1] to [23], wherein the temperature of the substrate in the buffer layer formation step is in a range of room temperature to 1,000° C.

[25] A method for producing a group III nitride semiconductor light-emitting device according to [24], wherein the temperature of the substrate in the buffer layer formation step is in a range of 200° C. to 800° C.

[26] A method for producing a group III nitride semiconductor light-emitting device according to any one of [1] to [25], wherein the temperature of the substrate in the base layer formation step is 900° C. or more.

[27] A group III nitride semiconductor light-emitting device comprising a substrate; a buffer layer made of a group III nitride which is laminated on the substrate; an n-type semiconductor layer comprising a base layer which is laminated on the buffer layer; a light-emitting layer which is laminated on the n-type semiconductor layer; and a p-type semiconductor layer which is laminated on the light-emitting layer, wherein the substrate is pretreated with plasma:

the buffer layer has a composition represented by $Al_xGa_{1-x}N$ ($0 \leq x < 1$) which is obtained by activating with plasma and reacting at least a metal gallium raw material and a gas containing a group V element; and the base layer is formed on the buffer layer.

[28] A group III nitride semiconductor light-emitting device according to [27], wherein the base layer is a layer which is formed by a metalorganic chemical vapor deposition method on the buffer layer.

[29] A group III nitride semiconductor light-emitting device according to [27] or [28], wherein the buffer layer is formed by a reactive sputtering method.

[30] A group III nitride semiconductor light-emitting device according to any one of [27] or [29], wherein the buffer layer is made of GaN.

[31] A group III nitride semiconductor light-emitting device according to any one of [27] to [30], wherein the substrate is made of sapphire.

[32] A group III nitride semiconductor light-emitting device according to any one of [27] to [31], wherein the buffer layer is formed so as to cover at least 90% of a main surface of the substrate.

[33] A group III nitride semiconductor light-emitting device according to any one of [27] to [32], wherein the buffer layer is made of a single crystal.

[34] A group III nitride semiconductor light-emitting device according to any one of [27] to [32], wherein the buffer layer contains columnar crystals.

[35] A group III nitride semiconductor light-emitting device according to any one of [27] to [34], wherein the thickness of the buffer layer is in a range of 10 to 500 nm.

[36] A group III nitride semiconductor light-emitting device according to any one of [27] to [35], wherein the thickness of the buffer layer is in a range of 20 to 100 nm.

[37] A group III nitride semiconductor light-emitting device according to any one of [27] to [36], wherein the base layer is made of a GaN-based compound semiconductor.

[38] A group III nitride semiconductor light-emitting device according to any one of [27] to [37], wherein the substrate has a main surface comprising a planar C plane and two or greater convex portions formed on the planar C plane, and the buffer layer covers the main surface of the substrate.

[39] A group III nitride semiconductor light-emitting device according to [38], wherein the convex portion has a base width in a range of 0.05 to 5 μm, a height in a range of 0.05 to 5 μm, the height is ¼ or greater relative to the base width, and an interval between adjacent convex portions is 0.5 to 5 times the base width.

[40] A group III nitride semiconductor light-emitting device according to [38] to [39], wherein the convex portion has a shape of which an external form becomes smaller toward a top of the convex portion.

[41] A group III nitride semiconductor light-emitting device according to any one of [38] to [40], wherein the convex portion has a substantially circular cone shape or a substantially polygonal pyramid shape.

[42] A group III nitride semiconductor light-emitting device obtained by the method according to any one of [1] to [26].

[43] A lamp comprising the group III nitride semiconductor light-emitting device according to any one of [27] to [42].

Effects of the Present Invention

The method for producing a group III nitride semiconductor light-emitting device of present invention comprises the pretreatment step in which the substrate is treated with plasma; the buffer layer formation step in which the buffer layer having a composition represented by $Al_xGa_{1-x}N$ ($0 \leq x < 1$) is formed on the pretreated substrate by activating with plasma and reacting at least a metal gallium raw material and a gas containing a group V element; and the base layer formation step in which the base layer is formed on the buffer layer. Therefore, the buffer layer having high uniformity and orientation can be formed.

In addition, since a base layer having high crystallinity can be formed on the buffer layer, lattice mismatch does not occur between the substrate and the semiconductor layer made of the group III nitride semiconductor. Due to this, it is possible to grow the group III nitride semiconductor having high crystallinity on the substrate with high efficiency. It is also possible to produce the group III nitride semiconductor light-emitting device having excellent light-emitting properties with high productivity.

In addition, the group III nitride semiconductor light-emitting device of the present invention comprises the substrate which is pretreated with plasma, the buffer layer which is formed on the pretreated substrate, and has a composition represented by $Al_xGa_{1-x}N$ ($0 \leq x < 1$) which is formed by activating with plasma and reacting at least a metal gallium raw material and a gas containing a group V element, and the base layer which is formed on the buffer layer. Therefore, the layers constituting the group III nitride semiconductor, which are formed on the buffer layer, have excellent crystallinity. Due to this, it is possible to produce a group III nitride semiconductor light-emitting device having excellent light-emitting properties.

In addition, since the lamp of the present invention comprises the group III nitride compound semiconductor light-emitting device, the lamp has excellent light-emitting properties.

BEST MODE FOR CARRYING OUT THE INVENTION

Below, the method for producing a group III nitride semiconductor light-emitting device, the group III nitride semiconductor light-emitting device, and the lamp including the group III nitride semiconductor light-emitting device are explained referring to FIGS. 1 to 10.

Moreover, the size, thickness, etc. of each part illustrated in figures differ from real size, thickness, etc in the actual group III nitride semiconductor light-emitting device.

[Group III Nitride Semiconductor Light-Emitting Device]

Figure 3:
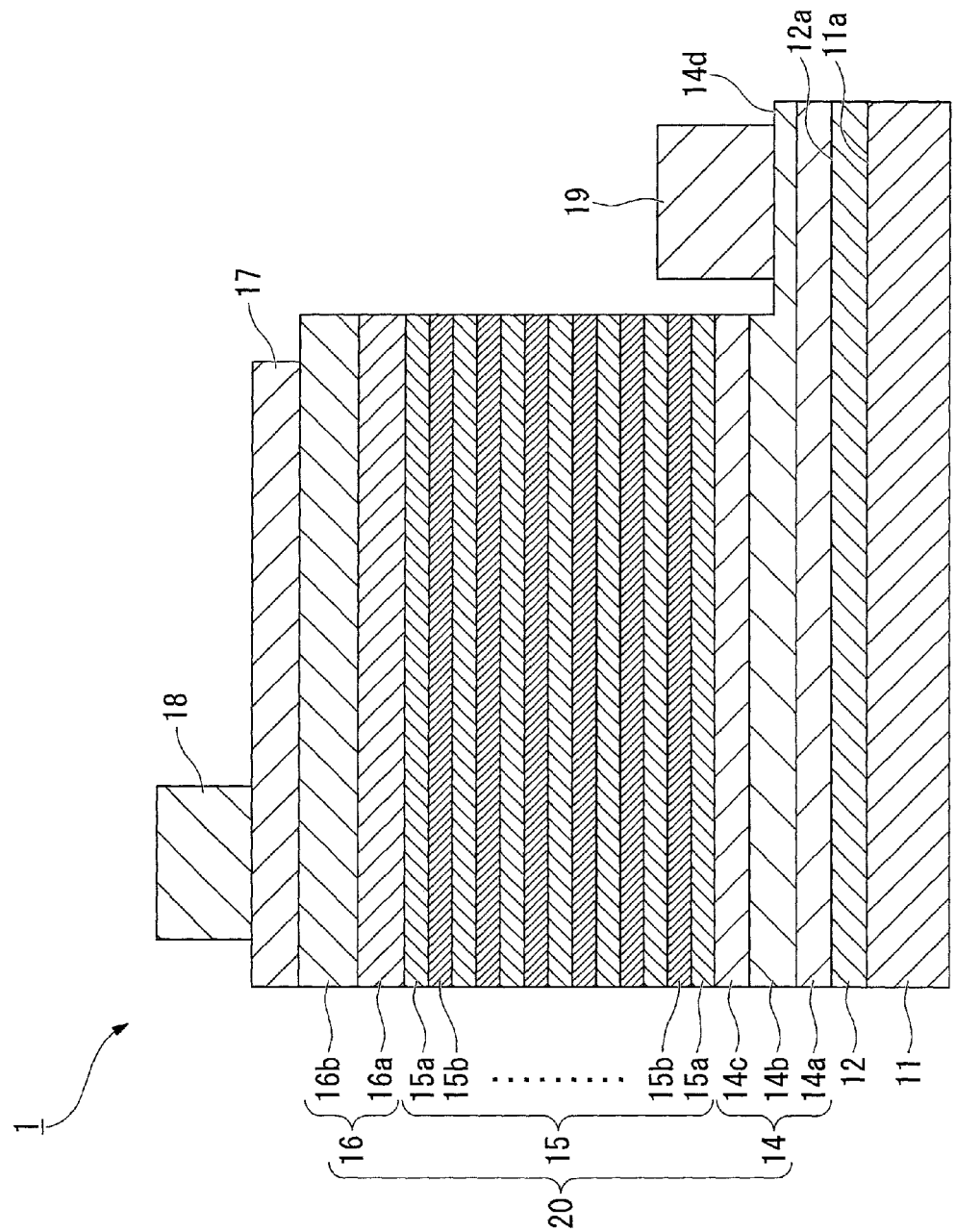
FIG. 3 is a sectional view showing one example of the group III nitride semiconductor light-emitting device according to the present invention.

For example, as shown in FIG. 3, in the group III nitride semiconductor light-emitting device (it may be called simply "light-emitting device") 1 of the present invention, a buffer layer 12 which is made of a group III nitride is formed on a substrate 11. The substrate 11 is treated with plasma in advance. An n-type semiconductor has a base layer 14a, a light-emitting layer 15, and a p-type semiconductor layer 16 laminated on the buffer layer 12 in this order. The buffer layer 12 is made of $Al_xGa_{1-x}N$ (0≤x<1) which is obtained by activating with plasma and reacting at least a metal gallium raw material and a gas containing a group V element. In addition, the base layer 14a is formed on the buffer layer 12 by the MOCVD method in this embodiment.

[Structure of the Light-Emitting Device]

Figure 1:
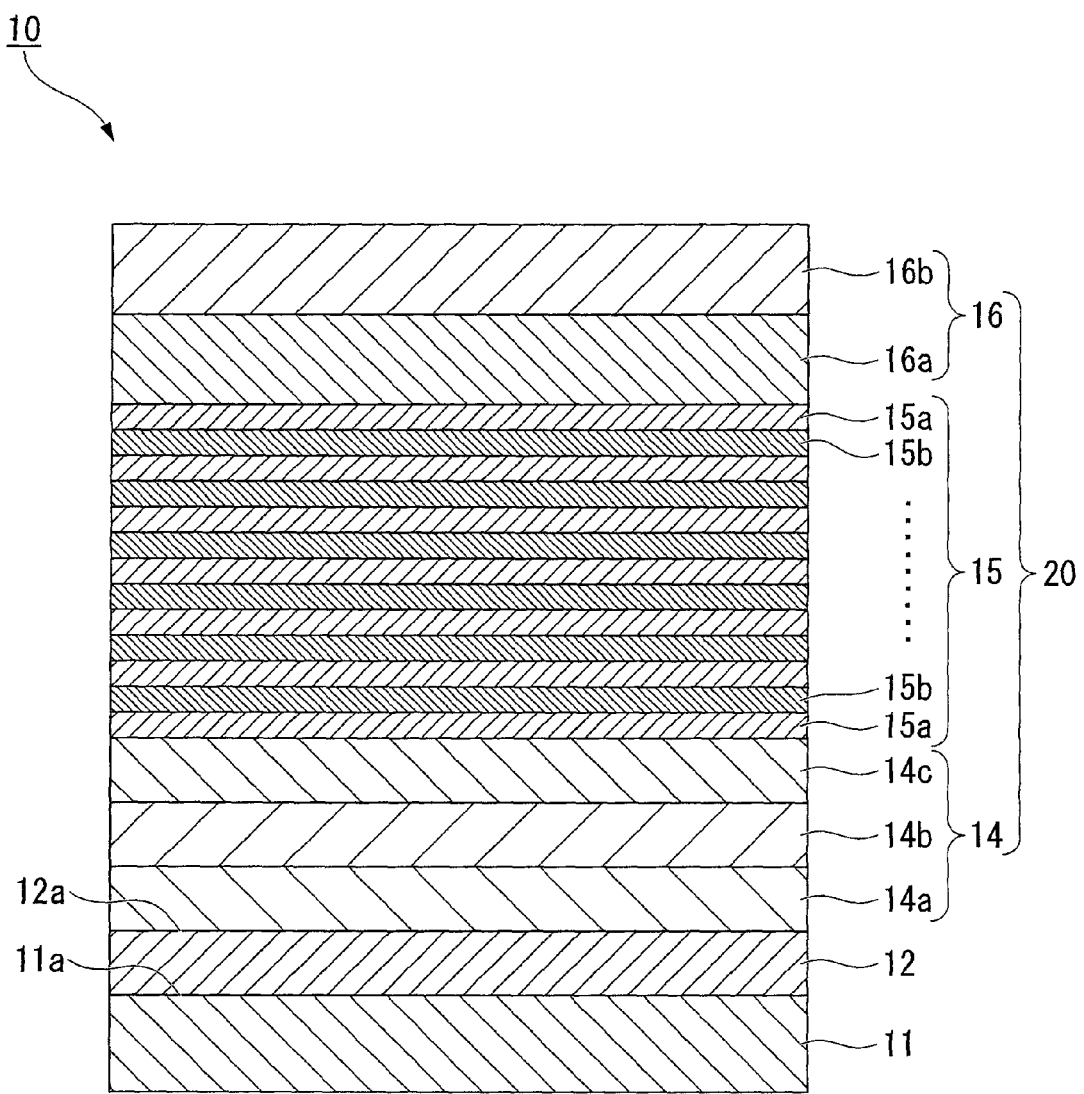
FIG. 1 is a view showing one example of the group III nitride semiconductor light-emitting device according to the present invention, and specifically a sectional view showing one example of the laminated semiconductor.

FIG. 1 is a sectional view showing one example of the laminated semiconductor constituting the group III nitride semiconductor light-emitting device according to the present invention. Specifically, FIG. 1 is a sectional view showing one example of laminate semiconductor comprising the group III nitride semiconductor formed on the substrate 11.

In the laminate semiconductor 10 shown in FIG. 1, the buffer layer 12 having a composition represented by $Al_xGa_{1-x}N$ (0≤x<1) is formed on the substrate 11. The semiconductor layer 20 is formed on the buffer layer 12. The semiconductor layer 20 includes the n-type semiconductor layer having the base layer 14a which is formed on the buffer layer 12, the light-emitting layer 15, and the p-type semiconductor layer.

Figure 2:
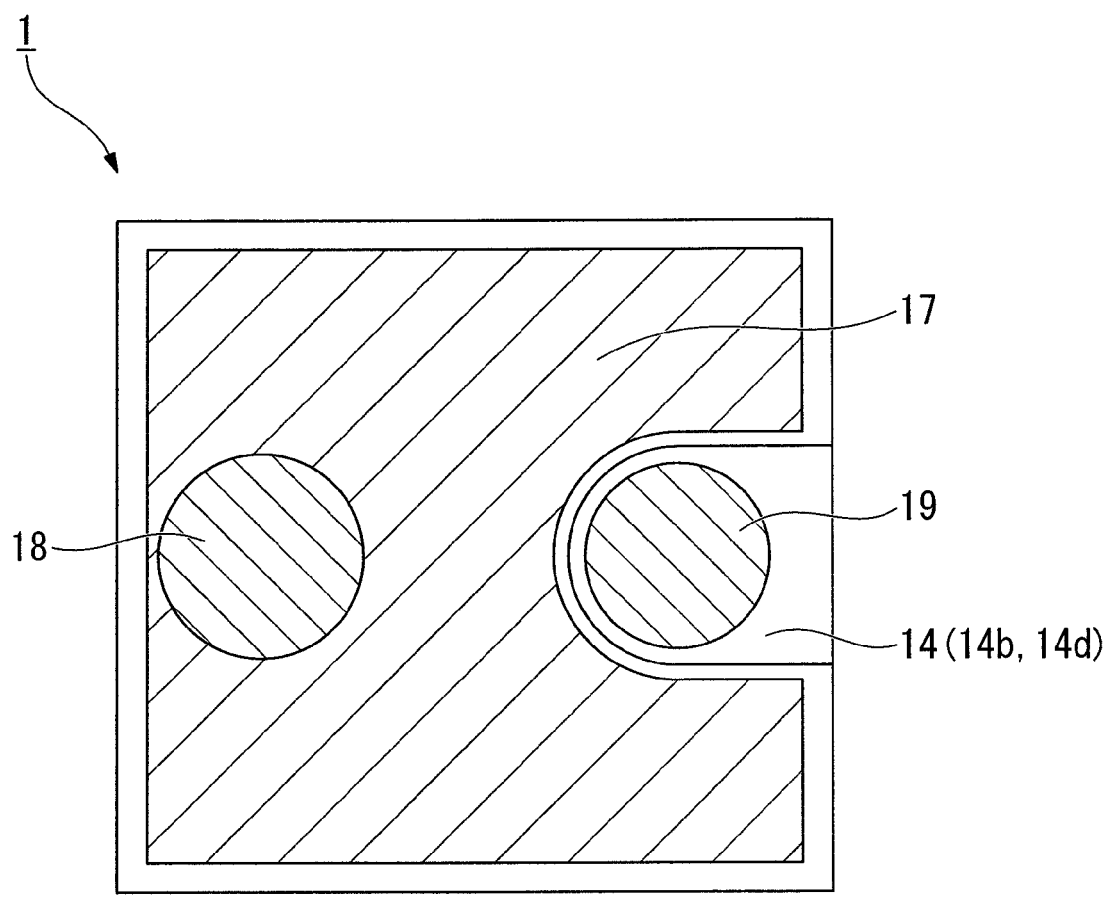
FIG. 2 is a planar view showing one example of the group III nitride semiconductor light-emitting device according to the present invention.

As shown in FIG. 2, which is a planar view, and FIG. 3, which is a sectional view, a transparent anode 17 is formed on the p-type semiconductor layer 16, and the anode bonding pad 18 is formed on the transparent anode 17 in the laminate semiconductor 10. In addition, a cathode 19 is laminated on an exposed area 14d formed on an n-type contact layer 14b of the n-type semiconductor layer 14. Thereby, the light-emitting device 1 of this embodiment is formed.

Below, a specific structure of the group III nitride semiconductor light-emitting device is explained.

[Substrate]

In general, materials on which the group III nitride semiconductor crystal can be epitaxially grown can be used as the material forming the substrate 11 on which the group III nitride semiconductor crystal is grown. Examples of the material for the substrate 11 include sapphire, SiC, silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum. Among these, materials having hexagonal crystal structure, such as sapphire and SiC, are preferable, because the group III nitride semiconductor having excellent crystallinity can be laminated. Furthermore, sapphire is the most preferable.

The size of the substrate is generally about two inches in diameter. However, the group III nitride semiconductor in the present invention can use the substrate having a diameter in a range of 4 inches to 6 inches.

When the buffer layer is formed without using ammonia, and the base layer is formed using ammonia, some oxide substrates and metal substrates cause chemical denaturation, because the substrates have contact with ammonia at high temperatures. Even when these oxide substrates and metal substrates are used, since the buffer layer acts as a coating layer, it is possible to prevent the chemical denaturation of the substrate in this embodiment of the present invention. In addition, in general, the sputtering can lower the temperature of the substrate. Due to this fact, even when the substrate is made of a material which decomposes at high temperatures, it is possible for each layer to be laminated on the substrate without causing any damage to the substrate 11.

[Buffer Layer]

In the laminate semiconductor 10 of this embodiment, the buffer layer 12 is formed on the substrate 11. The buffer layer 12 can be made of $Al_xGa_{1-x}N$ (0≤x<1) which is obtained by activating and reacting metal Ga raw material and a gas containing nitrogen elements by plasma. For example, the laminate semiconductor 10 can be formed by the reactive sputtering method. The layer which is obtained by the method using a plasma raw metal is easily orientated. Therefore, such a layer is preferably used as the buffer layer 12.

[Crystalline Structure]

The group III nitride crystal which makes the buffer layer formed using plasma raw metal has a hexagonal crystal structure. When the layer formation conditions are controlled, it is possible to make the group III nitride crystal be a single crystal. In addition, when the layer formation conditions are controlled, it is also possible to make the group III nitride crystal have a polycrystalline structure containing columnar crystals, that is, a texture based on hexagonal columnar crystals. Moreover, "columnar crystals" in the present invention means crystals each of which are separated by crystal grain boundaries between adjacent crystal grains, and has a columnar shape in longitudinal cross-section.

It is preferable that the buffer layer 12 have a single crystal structure, from the viewpoint of the functions of the buffer layer 12. As explained above, the group III nitride crystal is hexagonal, and forms a texture based on hexagonal columnar crystals. When the layer formation conditions are controlled, it is possible to make the group III nitride crystal grow in the in-plane direction. When the buffer layer having such a single crystal structure is formed on the substrate 11, the buffer layer effectively exerts the buffer functions. Thereby, the group III nitride semiconductor layer which is formed on the buffer layer 12 becomes a crystal layer having excellent orientation and crystallinity.

In addition, when the buffer layer has a polycrystal structure containing columnar crystals, it is preferable that an average grain width of the columnar crystals be in a range of 1 nm to 100 nm. The grain width of the crystals can be easily measured by cross-section observation of TEM (transmission electron microscope image).

[Composition]

The buffer layer 12 in the present invention is made of $Al_xGa_{1-x}N$ ($0 \leq x < 1$) which is obtained by activating and reacting metal Ga raw material and a gas containing a group V element by plasma. Specifically, the buffer layer 12 can be made of GaN. In addition, it is possible to use a group III nitride, such as AlGaInN. Furthermore, it is also possible to add a group V element, such as As and P. When the buffer layer 12 contains Ga, the content of Ga is preferably 50% or more.

It is also possible to make the buffer layer 12 using a material having the same crystalline structure as that of the group III nitride semiconductor constituting the semiconductor layer 20. Among these materials, a material which has a similar lattice length to that of the group III nitride semiconductor constituting the following base layer 14a is preferably used. In particular, nitrides of the group IIIa elements are preferable.

[Thickness]

The thickness of the buffer layer 12 is preferably in a range of 10 nm to 500 nm. When the thickness of the buffer layer 12 is adjusted in the range, the buffer layer 12 having excellent orientation can be obtained. In addition, when the layers constituting the group III nitride semiconductor layer are formed on the buffer layer 12, the buffer layer 12 having the thickness in the range can act effectively as a coating layer.

When the thickness of the buffer layer 12 is less than 10 nm, the buffer layer 12 may not sufficiently act as the coating layer. In contrast, when it exceeds 500 nm, the time for producing the buffer layer is longer and the productivity is decreased, nevertheless there is no change of the functions as the buffer layer.

Moreover, the thickness of the buffer layer 12 is more preferably in a range of 20 nm to 100 nm.

[Covering Percentage]

When functions for covering the substrate 11 are concerned, it is preferable that the buffer layer 12 be formed so as to cover 60% or more, more preferably 80% or more, and most preferably 90% or more of the entire main surface 11a of the substrate 11. In particular, it is most preferable that the buffer layer 12 be formed so as to cover 100% of the main surface 11a of the substrate 11. In other words, it is most preferable that the buffer layer 12 be formed so as to cover the entire main surface 11a of the substrate 11 without exposing the main surface 11a. When the area of the main surface 11a of the substrate 11, which is covered with the buffer layer 12, is smaller, the substrate 11 is largely exposed. Due to this, the buffer layer 12 does not act as the coating layer. Thereby, since the semiconductor material for growing the group III nitride semiconductor crystal and the substrate react, there is a possibility that the flatness of the base layer 14a formed on the buffer layer 12 may decrease.

Figure 6A:
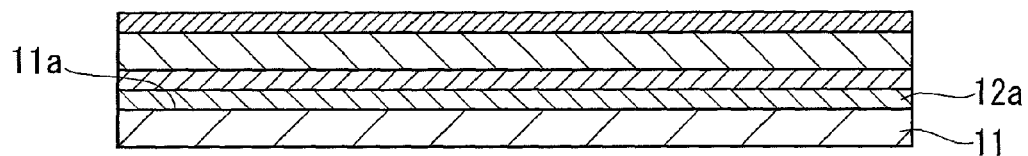
FIG. 6A is a view showing one example of the group III nitride semiconductor light-emitting device according to the present invention, and specifically a sectional view showing a buffer layer laminated on the substrate.
Figure 6B:
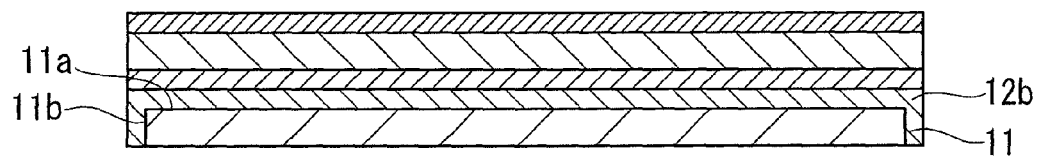
FIG. 6B is a view showing one example of the group III nitride semiconductor light-emitting device according to the present invention, and specifically a sectional view showing another buffer layer laminated on the substrate.
Figure 6C:
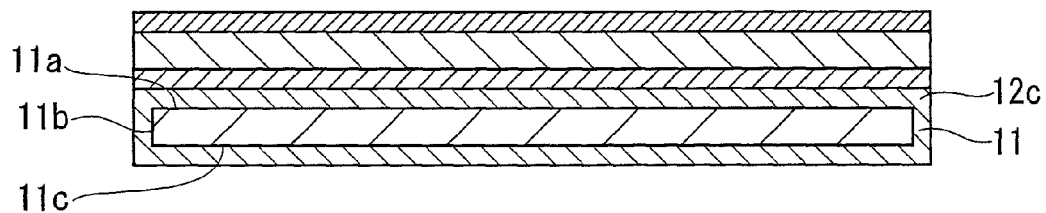
FIG. 6C is a view showing one example of the group III nitride semiconductor light-emitting device according to the present invention, and specifically a sectional view showing another buffer layer laminated on the substrate.

As shown in FIG. 6A, the buffer layer 12a may be formed on the substrate 11 so as to cover only the main surface 11a of the substrate 11 as shown in FIG. 6A. However, the buffer layer 12a may also be formed so as to cover the main surface 11a, and the side surfaces 11b of the substrate 11, as shown in FIG. 6B. As shown in FIG. 6C, it is most preferable that the buffer layer 12c be formed so as to cover the main surface 11a, the side surfaces 11b and the back surface 11c of the substrate 11, when the functions of the buffer layer as the coating layer are concerned.

As explained above, when the base layer 14a (the base layer 14a is explained below in detail) is formed by the MOCVD method, the raw gas may reach the side surfaces, and back surface of the substrate 11. In order to prevent the reaction between the raw gas and the substrate, it is most preferable that the buffer layer 12c be formed so as to protect the side surfaces and back surface of the substrate 11, as shown in FIG. 6C.

[Semiconductor Layer]

As shown in FIG. 1, the laminate semiconductor 10 in this embodiment includes the substrate 11, the buffer layer 12 formed on the substrate 11, and the semiconductor layer 20 formed on the buffer layer 12. The semiconductor layer 20 is made of the group III nitride semiconductor, and includes the n-type semiconductor 14 having the base layer 14a, the light-emitting layer 15, and the p-type semiconductor layer 16. In the laminate semiconductor 10 shown in FIG. 1, the base layer 14a provided with the n-type semiconductor layer 14 is formed on the buffer layer 12.

As the group III nitride semiconductor, for example, gallium nitride-based semiconductors, such as $Al_xGa_yIn_zN_{1-A}M_A$ ($0 \leq X \leq 1$, $0 \leq Y \leq 1$, $0 \leq Z \leq 1$, $X+Y+Z=1$, M denotes group V element other than nitrogen (N), and $0 \leq A < 1$) are well known. In the present invention, any gallium nitrides semiconductors represented by $Al_xGa_yIn_zN_{1-A}M_A$ ($0 \leq X \leq 1$, $0 \leq Y \leq 1$, $0 \leq Z \leq 1$, $X+Y+Z=1$, M denotes a group V element other than nitrogen (N), and $0 \leq A < 1$), and well-known gallium nitride-based semiconductors can be used without limitations.

The gallium nitride-based semiconductor can contain a group III element other than Al, Ga, and In. Specifically, the gallium nitride semiconductor can contain Ge, Si, Mg, Ca, Zn, Be, P, and/or As, if necessary. Furthermore, the gallium nitride semiconductor may contain not only the elements which are intentionally added but also impurities which are inevitably contained depending on the lamination conditions, or trace impurities which are contained in a raw material and reaction pipe, and the like.

[N-Type Semiconductor Layer]

In general, the n-type semiconductor layer 14 is laminated on the buffer layer 12, and includes the base layer 14a, the n-type contact layer 14b, and the n-type clad layer 14c. The n-type contact layer 14b can be served as the base layer 14a and/or the n-type clad layer 14c.

[Base Layer]

The base layer 14a in this embodiment is made of the group III nitride semiconductor, and is formed by laminating the group III nitride semiconductor on the buffer layer 12 by a well-known MOCVD method.

It is not always necessary that the base layer 14a be formed using the same material as that of the buffer layer 12 formed on the substrate 11. It is possible to form the base layer using the different material from that of the buffer layer 12. However, the base layer 14a is preferably made of $Al_yGa_{1-y}N$ ($0 \leq y \leq 1$, preferably $0 \leq y \leq 0.5$, and more preferably $0 \leq y \leq 0.1$).

As the material for the base layer 14a, the group III nitride containing Ga, that is, a GaN-based compound semiconductor is preferable. In particular, AlGaN or GaN is preferably used.

The thickness of the base layer 14a is preferably in a range of 1 μm to 10 μm, because of obtaining excellent crystallinity. It is more preferably in a range of 5 μm to 7 μm, because of improving crystallinity and productivity, and reducing the time for forming the layer.

The base layer 14a may be doped with an n-type impurity in a range of from $1 \times 10^{17}$ to $1 \times 10^{19}/cm^3$, if necessary. However, the base layer 14a may be undoped ($<1 \times 10^{17}/cm^3$). The undoped base layer 14a is preferable, because it can maintain excellent crystallinity.

When a conductive substrate is used as the substrate 11, electrodes can be formed on both sides of the light-emitting device 1 by doping the base layer 14a.

When an insulating substrate is used as the substrate 11, electrodes, that is, the anode and the cathode, are formed on the identical surface of the light-emitting device 1. Therefore, the base layer 14a is preferably made of undoped crystals. When the base layer 14a is undoped, the base layer 14a has excellent crystallinity.

Moreover, any n-type impurities can be used. Examples of the n-type impurities include Si, Ge, and Sn. Si and Ge are preferable.

[N-Type Contact Layer]

The n-type contact layer 14b in this embodiment is made of the group III nitride semiconductor, and is formed on the base layer 14a by the MOCVD method or the sputtering method.

It is preferable that the n-type contact layer 14b be made of $Al_xGa_{1-x}N$ ($0 \leq x \leq 1$, preferably $0 \leq x \leq 0.5$, and more preferably $0 \leq x \leq 0.1$), similar to the base layer 14a. In addition, the n-type contact layer 14b is preferably doped with the n-type impurities. The concentration of the n-type impurities is preferably in a range of from $1 \times 10^{17}$ to $1 \times 10^{19}/cm^3$, and more preferably in a range of from $1 \times 10^{18}$ to $1 \times 10^{19}/cm^3$. When the n-type impurities are doped in the range, it is possible to maintain excellent ohmic contact to the cathode and crystallinity, and prevent the generation of cracks. Any n-type impurities can be used. Examples of the n-type impurity include Si, Ge, and Sn. Among these, Si and Ge are preferable.

The growth temperatures of the n-type contact layer 14b is the same temperatures as those of the base layer 14a.

Moreover, as explained above, the n-type contact layer 14b may serve as the base layer 14a.

The gallium nitride-based semiconductor which constitutes the base layer 14a and the n-type contact layer 14b has preferably the identical composition.

The total thickness of the base layer 14a and the n-type contact layer 14b is preferably in a range of from 1 μm to 20 μm, more preferably in a range of from 5 to 15 μm, and most preferably in a range of from 7 μm to 12 μm. When the total thickness of these layers is in the range, excellent crystallinity of the semiconductor can be maintained.

[N-Type Clad Layer]

It is preferable that the n-type clad layer 14c be formed between the n-type contact layer 14b and the light-emitting layer 15 (the light-emitting layer 15 is explained in detail below). When the n-type clad layer 14c is formed, it is possible to improve flatness of the outermost surface of the n-type contact layer 14b. The n-type clad layer 14c can be formed by the MOCVD method, etc using AlGaN, GaN, GaInN, etc. The n-type clad layer 14c also has the hetero junction structure of the layers made of AlGaN, GaN, or GaInN, or the superlattice structure in which the layer is laminated two or more times. When the n-type clad layer 14c is made of GaInN, it is needless to say that the band gap of the n-type clad layer 14c is preferably larger than that of the light-emitting layer 15.

The thickness of the n-type clad layer 14c is not limited, but it is preferably in a range of from 5 nm to 500 nm, and more preferably in a range of from 5 nm to 100 nm.

The concentration of the n-type dopant in the n-type clad layer 14c is preferably in a range of $1 \times 10^{17}$ to $1 \times 10^{20}/cm^3$, and more preferably in a range of $1 \times 10^{18}$ to $1 \times 10^{19}/cm^3$. When the concentration of the dopant is in the range, it is possible to maintain excellent crystallinity and decrease the operation voltage of the light-emitting device.

Moreover, when the n-type clad layer 14c has the superlattice structure, the structure may be one in which an n-side first layer which is made of the group III nitride semiconductor and has the thickness of 100 Å or less, and an n-side second layer which is made of the group III nitride semiconductor having the different composition from that of the n-side first layer and has the thickness of 100 Å or less, are laminated, which is not shown in figures. The n-type clad layer 14c may also have a structure in which the n-side first layer and the n-side second layer are alternately and repeatedly laminated. In addition, any one of the n-side first layer and the n-side second layer may contact with the light-emitting layer 15.

The n-side first layer and the n-side second layer may have AlGaN-based composition (it may be simply called "AlGaN"), GaInN-based composition (it may be simply called "GaInN"), or GaN composition. The n-side first layer and the n-side second layer may have an alternate structure of GaInN/GaN, AlGaN/GaN, GaInN/AlGaN. In addition, they also may have an alternate structure of GaInN/GaInN having a different composition (in the present invention, a different composition means the elemental ratio in the composition is different, in the same way below) or an alternate structure of AlGaN/AlGaN having a different composition. In the present invention, the n-side first layer and the n-side second layer are preferably the alternate structure of GaInN/GaN or the alternate structure of GaInN/GaInN having a different composition.

The thickness of the n-side first layer and the n-side second layer which is the superlattice layer is preferably 60 Å or less, more preferably 40 Å or less, and most preferably in a range of 10 Å to 40 Å, respectively. When the thickness of the n-side first layer and the n-side second layer, which is the superlattice layer, exceeds 100 Å, crystalline faults easily occur, and this is not preferable.

The n-side first layer and the n-side second layer may be doped. They may have the combination of a doped structure/undoped structure. Well-known impurities, which have been doped in the material having the above-mentioned composition, can be used without limitation. For example, when the n-type clad layer has the alternate structure of GaInN/GaN or the alternate structure of GaInN/GaInN having a different composition, Si is preferably used as the impurity. In addition, the n-side superlattice multilayer layer may have the same composition, such as GaInN, AlGaN, and GaN, or may be formed by doped or undoped.

[Light Emitting Layer]

The light-emitting layer 15 is laminated on the n-type semiconductor layer 14, and the p-type semiconductor layer 16 is laminated thereon. The light-emitting layer 15 can be formed by a well-known MOCVD method, etc. As shown in FIG. 1, the light-emitting layer 15 includes barrier layers 15a made of gallium nitride-based semiconductor, and well layers 15b made of gallium nitride-based semiconductor containing indium in a repeated manner, and the barrier layer 15a and the well layer 15b are alternately and repeatedly laminated. In the light-emitting layer 15 in the embodiment shown in FIG. 1, the barrier layer 15a faces the n-type semiconductor layer 14 and the p-type semiconductor layer 16 respectively.

In addition, the light-emitting layer 15 has the structure in which seven barrier layers 15a and six well layers 15b are alternately laminated in FIG. 1. The barrier layer 15a is positioned at the uppermost and lowermost surface of the light-emitting layer 15. The well layer 15b is positioned between the barrier layers 15a.

As the material for the barrier layer 15a, a gallium nitride-based semiconductor, such as $Al_cGa_{1-c}N$ ($0 \leq c < 0.3$), which has a larger band gap energy than that of the gallium nitride-based semiconductor containing indium and constituting the well layer 15b, is preferably used.

In addition, as the material for the well layer 15b, for example, gallium nitride-based semiconductor containing indium, such as $Ga_{1-s}In_sN$ ($0 < s < 0.4$).

The entire thickness of the light-emitting layer 15 is not particularly limited. However, the thickness of the light-emitting layer 15 is preferably in a range of from 1 nm to 500 nm, and more preferably around 100 nm. When the thickness of the light-emitting layer 15 is in the range, light-emitting power can be improved.

[P-Type Semiconductor Layer]

In general, the p-type semiconductor layer 16 includes the p-type clad layer 16a and the p-type contact layer 16b. These layers can be formed by the MOCVD method or the reactive sputtering method. Moreover, the p-type contact layer 16a may serve as the p-type clad layer 16b.

The p-type semiconductor layer 16 in this embodiment is doped with the p-type impurity to adjust the conductivity to p-type. Any p-type impurity can be used without limitations. However, Mg is preferably used as the p-type impurity. In addition, Zn can also be used.

In addition, the entire thickness of the p-type semiconductor layer 16 is not particularly limited. However, it is preferably in a range of 0.05 μm to 1 μm.

[P-Type Clad Layer]

The material for the p-type clad layer 16 may have any composition which has a lager band gap than that of the light-emitting layer 15 and can block the carrier toward the light-emitting layer 15. Examples of the preferable material include $Al_dGa_{1-d}N$ ($0 < d \leq 0.4$, and preferably $0.1 \leq d \leq 0.3$). The p-type clad layer 16a made of AlGaN is preferable, from the viewpoint of block of the carriers toward the light-emitting layer 15.

The thickness of the p-type clad layer 16a is not particularly limited. However, the thickness of the p-type clad layer 16a is in a range of from 1 nm to 400 nm, and more preferably in a range of 5 nm to 100 nm.

When the p-type clad layer 16a is doped with the p-type impurity, the dopant concentration in the p-type clad layer 16a is in a range of from $1 \times 10^{18}$ to $5 \times 10^{21}/cm^3$, and more preferably in a range of from $1 \times 10^{19}$ to $5 \times 10^{20}/cm^3$. When the dopant concentration in the p-type clad layer 16a is in the range, excellent p-type crystals can be obtained without reducing the crystallinity.

The p-type clad layer 16a in this embodiment can have the superlattice structure in which layers are laminated, similar to the n-type clad layer 14c. When the p-type clad layer 16a has the superlattice structure, the superlattice structure may be one in which an p-side first layer which is made of the group III nitride semiconductor and has the thickness of 100 Å or less, and a p-side second layer which is made of the group III nitride semiconductor having the different composition from that of the p-side first layer and has the thickness of 100 Å or less, are laminated, are laminated. The detailed lamination structure is not shown in figures. The p-type clad layer 16a may also have a structure in which the p-side first layer and the p-side second layer are alternately and repeatedly laminated.

The p-side first layer and the p-side second layer may have the different composition, for example, AlGaN, GaInN, or GaN. In addition, the p-side first layer and the p-side second layer may have an alternate structure of GaInN/GaN, AlGaN/GaN, or GaInN/AlGaN. In the present invention, the p-type first layer and the p-type second layer have preferably the alternate structure of AlGaN/AlGaN or AlGaN/GaN.

The thickness of the p-side first layer and the p-side second layer which is the superlattice layer is preferably 60 Å or less, more preferably 40 Å or less, and most preferably in a range of 10 Å to 40 Å, respectively. When the thickness of the p-side first layer and the p-side second layer, which is the superlattice layer, exceeds 100 Å, crystalline faults easily occur, and this is not preferable.

The p-side first layer and the p-side second layer may be doped. They may have the combination of doped structure/undoped structure. Well-known impurities, which have been doped in the material having the above-mentioned composition, can be used without limitation. For example, when the p-type clad layer has the alternate structure of AlGaN/GaN, or the alternate structure of AlGaN/AlGaN having a different composition, Mg is preferably used as the impurity. In addition, the p-side superlattice multilayer layer may have the same composition, such as GaInN, AlGaN, and GaN, or may be formed by a doped or undoped structure.

[P-Type Contact Layer]

The p-type contact layer 16b is a gallium nitride-based semiconductor layer containing at least $Al_eGa_{1-e}N$ ($0 \leq e < 0.5$, preferably $0 \leq e \leq 0.2$, and more preferably $0 \leq e \leq 0.1$). It is preferable that the Al in the range be contained in the p-type contact layer 16b, because excellent ohmic contact with the p-ohmic electrode (refer to a translarent electrode 17 explained below) is obtained and excellent crystallinity can be maintained.

The thickness of the p-type contact layer 16b is not particularly limited. However, the thickness of the p-type contact layer 16b is preferably in a range of from 10 nm to 500 nm, and more preferably in a range of from 50 nm to 200 nm. This thickness range of the p-type contact layer 16b is preferable from the viewpoint of light-emitting output power.

In addition, when the p-type contact layer 16b is doped with the p-type impurity, the p-type dopant is preferably contained in a range of from $1 \times 10^{18}$ to $1 \times 10^{21}/cm^3$. When the p-type dopant concentration is in the range, it is possible to maintain excellent ohmic contact and crystallinity, and prevent the generation of cracks. The p-type dopant concentration is more preferably in a range of from $5 \times 10^{19}$ to $5 \times 10^{20}/cm^3$.

As explained above, the buffer layer 12, which is made of $Al_xGa1-xN$ ($0 \leq X < 1$) obtained by activating with plasma and reacting at least a metal gallium raw material and a gas containing a group V element, is formed on the main surface 11a of the substrate 11, and the base layer 14a produced by the MOCVD method is formed on the buffer layer 12 in this embodiment.

In this way, since the base layer 14a having excellent crystallinity is laminated on the buffer layer 12 having high uniformity and excellent orientation, each layer constituting the semiconductor layer 20, which is formed on the base layer 14a, has also excellent crystallinity. Due to this, it is possible to produce the group III nitride semiconductor light-emitting device having high light-emitting properties.

[Transparent Anode]

The transparent anode 17 is a transparent electrode formed on the p-type semiconductor layer 16 (that is, p-type contact layer 16b) in the laminate semiconductor 10.

The transparent anode 17 is made of any materials. Examples of the material include ITO ($In_2O_3$—$SnO_2$), AZO (ZnO—$Al_2O_3$), IZO ($In_2O_3$—ZnO), and GZO (ZnO—$GeO_2$). The transparent anode 17 can be formed by well-known methods in this technical field using the material. In addition, any structures including conventional well-known structures can be used without limitations.

The transparent anode 17 may be formed so as to cover almost the entire surface of the Mg-doped p-type semiconductor layer 16. In addition, the transparent anode 17 may also be formed in a lattice shape or a tree shape so as to have intervals.

[Anode Bonding Pad and Cathode]

The anode bonding pad 18 is an electrode formed on the transparent anode 17.

Various materials such as Au, Al, Ni, Cu, etc. are known as a material for the anode bonding pad 18. In addition, various structures for the anode boding pad are also known. Various well-known materials and structures can be used as the anode bonding pad 18 in the present invention without limitations.

The thickness of the anode bonding pad 18 is preferably in a range of from 100 nm to 1,000 nm. The thicker the anode bonding pad 18, the higher the bondability. Therefore, it is preferable that the thickness of the anode bonding pad 18 be 300 nm or more. From the viewpoint of the production cost, it is preferably 500 nm or less.

The cathode 19 is formed so as to contact to the n-type contact layer 14b in the n-type semiconductor layer 14 in the semiconductor layer in which the n-type semiconductor layer 14, the light-emitting layer 15, and the p-type semiconductor layer 16 are laminated on the substrate 11 in turn. Therefore, a part of the p-type semiconductor 16, the light-emitting layer 15, and the n-type semiconductor layer 14 is removed to form an exposed area 14d in the n-type contact layer 14b, and then the cathode 19 is formed on the exposed area 14d.

The cathode 19 can be formed by a well-known method using any materials and structure in this technical field without limitation.

As explained above, the buffer layer 12, which is made of $Al_xGa_{1-x}N$ (0≤X<1) obtained by activating with plasma and reacting at least a metal gallium raw material and a gas containing a group V element, is formed on the main surface 11a of the substrate 11 which is pretreated with plasma, and the base layer 14a produced by the MOCVD method is formed on the buffer layer 12 in the group III nitride semiconductor light-emitting device 1 of this embodiment. Therefore, each layer constituting the semiconductor layer 20 made of the group III nitride semiconductor, which is formed on the base layer 14a, has also excellent crystallinity. Due to this, it is possible to produce the group III nitride semiconductor light-emitting device having high light-emitting properties.

The substrate 11, the buffer layer 12 and the base layer 14a, which are explained in this embodiment, are not only used in a group III nitride semiconductor light-emitting device. For example, in various electronic devices, when layers are made using materials having the same degree of lattice constants and the material gas and the substrate may be reacted in high temperatures, the buffer layer and the base layer can be used without any limitations.

[A Production Method for the Group III Nitride Semiconductor Light-Emitting Device]

The method for producing a group III nitride semiconductor light-emitting device according to this embodiment is a method in which the buffer layer made of the group III nitride is laminated on the substrate 11, the n-type semiconductor layer having the base layer 14a, the light-emitting layer 15, and the p-type semiconductor layer 16 are laminated on the buffer layer 12 in this order, wherein the method includes a pretreatment step in which the substrate 11 is treated with plasma; a buffer layer formation step after the pretreatment step, in which the buffer layer 12 having the composition represented by $Al_xGa_{1-x}N$ (0≤x<1) is formed on the pretreated substrate by activating with plasma and reacting at least a metal gallium raw material and a gas containing a group V element; and a base layer formation step in which the base layer 14a is formed on the buffer layer 12.

In this embodiment, the base layer 14a is formed on the buffer layer 12 by the MOCVD method.

In the production method according to this embodiment, when the laminate semiconductor 10 is formed by epitaxially growing the group III nitride semiconductor crystals on the substrate 11, as shown in FIG. 1, first, the pretreatment step in which the main surface 11a of the substrate 11 is pretreated with plasma, is carried out. Then, the buffer layer 12 is formed on the substrate, and the semiconductor layer 20 is formed on the buffer layer 12.

In this embodiment, the buffer layer 12 made of GaN is formed on the substrate 11 by the reactive sputtering method which activates with plasma and reacting at least a metal gallium raw material and a gas containing nitrogen. Then, the base layer 14a included in the n-type semiconductor layer 14 is formed on the buffer layer 12 by the MOCVD method. After that, the n-type contact layer 14b, the n-type clad layer 14c, the light-emitting layer 15, and the p-type semiconductor layer 16 are formed by the MOCVD method respectively.

In addition, according to the production method in this embodiment, as shown in the planar view of FIG. 2, and the sectional view of FIG. 3, the transparent anode 17 is formed on the p-type semiconductor 16 in the laminate semiconductor 10, and the cathode bonding pad 18 is formed on the transparent anode 17. At the same time, the cathode 19 is formed on the exposed area 14d formed in an n-type contact layer 14b of the n-type semiconductor layer 14. Thereby, the light-emitting device 1 of this embodiment is produced.

Below, the method for producing a group III nitride semiconductor light-emitting device according to this embodiment is explained in detail.

[Pretreatment Step]

In the pretreatment step in this embodiment, prior to formation of the buffer layer 12 on the substrate 11, the main surface 11a of the substrate 11 is pretreated with plasma, for example, by the sputtering method.

Specifically, the substrate 11 is exposed with plasma containing a gas which generates active plasma species, such as Ar, $N_2$, and $O_2$ to remove organic materials or oxides attached to the main surface 11a of the substrate. Thereby, the main surface 11a of the substrate can be prepared. As an example of the plasma treatment, for example, sputter cleaning, in which the main surface 11a of the substrate 11 is exposed with plasma, such as Ar gas and $N_2$ gas, can be preferably used.

In this case, when voltage (power) is applied between the substrate 11 and the chamber, plasma particles are effectively applied to the main surface 11a of the substrate 11. When the substrate 11 is pretreated in this way, it is possible to form the buffer layer 12 on the entire main surface 11a of the substrate 11, and to improve the crystallinity of the layer formed on the buffer layer 12.

The gas atmosphere in the plasma treatment of the substrate 11 may be a gas containing one kind of gas, or a mixture gas containing two or more kinds of gas. The gas used in the plasma treatment is preferably a gas containing nitrogen.

In addition, the partial pressure of the gas containing nitrogen is preferably in a range of $1.0 \times 10^{-2}$ Pa to 10 Pa, and more preferably in a range of 0.1 Pa to 5 Pa. When the partial pressure of the gas containing nitrogen is too high, the energy of the plasma particles decreases, and efficiency of the pretreatment decreases. In contrast, when it is too low, the energy of the plasma particles is too large, and the substrate 11 may be damaged.

The time in the plasma pretreatment is preferably in a range of from 30 seconds to 3,600 seconds (1 hour). When the pretreatment time is shorter than the range, it is needless to say that the effects due to the plasma treatment are not obtained. In contrast, even when it exceeds 3,600 seconds, particular effects cannot be obtained and there is a possibility of reducing an operating ratio. The time for performing the plasma pretreatment is more preferably in a range of from 60 seconds (1 minute) to 600 seconds (10 minutes).

The temperature in the plasma pretreatment is preferably in a range of from 25° C. to 1,000° C. When the pretreatment temperature is too low, sufficient effects of the pretreatment cannot be obtained. In contrast, when it is too high, the surface of the substrate 11 may be damaged. The temperature in the plasma pretreatment is more preferably in a range of from 300° C. to 800° C.

Figure 8:
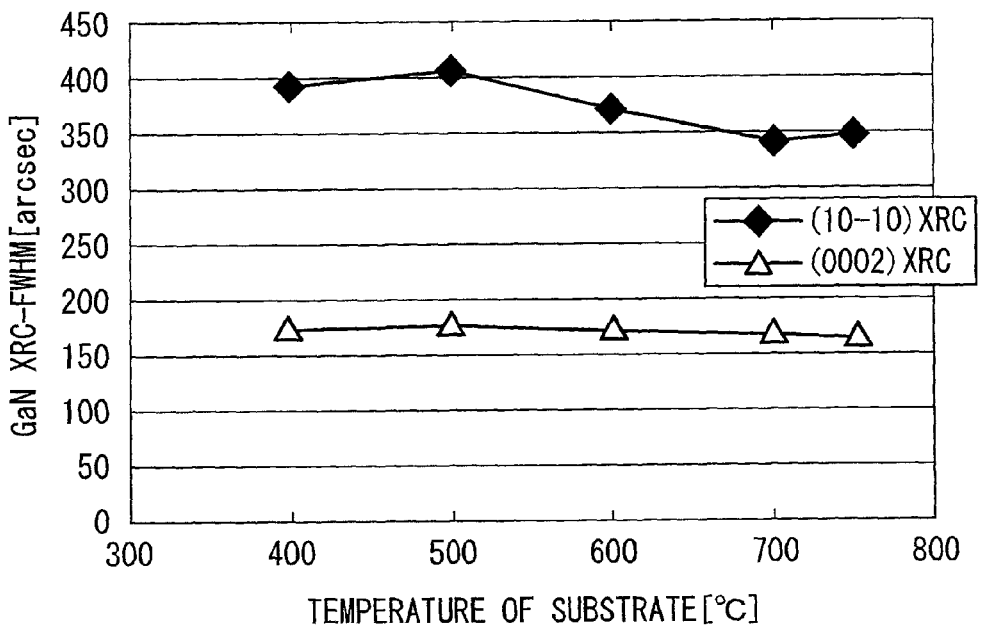
FIG. 8 is a graph explaining one example of the method for producing the group III nitride semiconductor light-emitting device according to the present invention, and specifically a graph showing the relationship between the temperature in the pretreatment step and an X-ray rocking curve in the (0002) plane and the (10-10) plane of the base layer.
Figure 9:
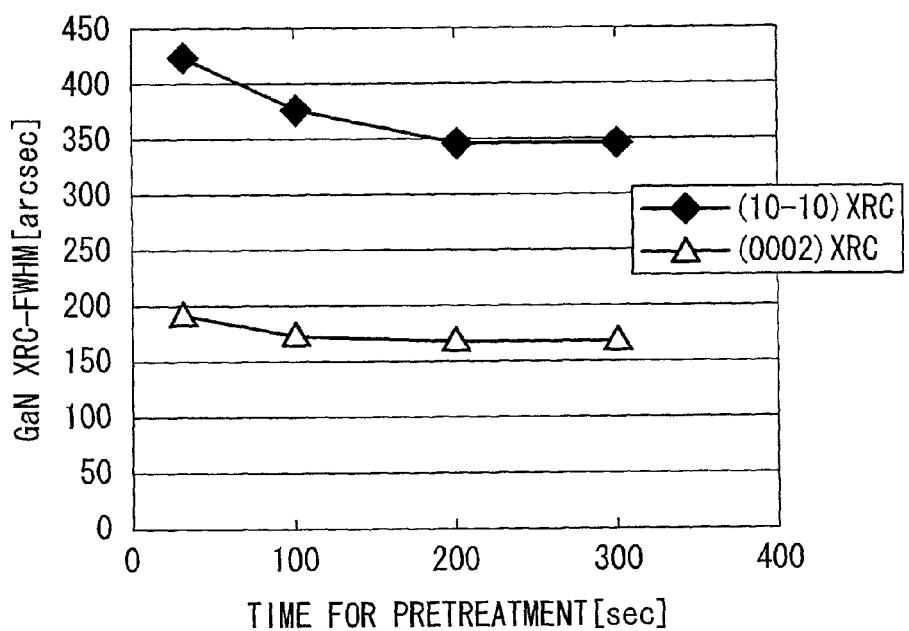
FIG. 9 is a graph explaining one example of the method for producing the group III nitride semiconductor light-emitting device according to the present invention, and specifically a graph showing the relationship between the time in the pretreatment step and an X-ray rocking curve in the (0002) plane and the (10-10) plane of the base layer.

Here, FIG. 8 shows the relationship between the temperature of the substrate 11 in the pretreatment step and a full width at half maximum in the X-ray rocking curve at the (0002) plane and the (10-10) plane of the base layer 14a. FIG. 9 shows the relationship between the temperature of the substrate 11 in the pretreatment step and a full width at half maximum in the X-ray rocking curve at the (0002) plane and the (10-10) plane of the base layer 14a.

As shown in FIGS. 8 and 9, it is clear that when the temperature and time in the pretreatment step are adjusted into the abovementioned ranges, the base layer 14a formed on the buffer layer 12 on the substrate 11 has excellent crystallinity and flatness.

In the pretreatment step in this embodiment, the chamber used in the plasma treatment may be the same chamber or a different chamber used in the buffer layer formation step for forming the buffer layer 12 subsequent to the pretreatment step. When both of the pretreatment step and the buffer layer formation step use the same chamber, cost of the manufacturing facility can be reduced. When the sputter cleaning is carried out as the plasma treatment in the same conditions as those in the buffer layer formation step, time for changing the sputtering conditions is not necessary. Therefore, the operation rate can be improved.

In the pretreatment step in this embodiment, it is preferable to use the sputter cleaning which generates plasma by the RF discharge (high frequency). When plasma is generated by the RF discharge, it is possible to subject the plasma treatment to the insulating substrate. Furthermore, it is more preferable to use the sputter cleaning which generates nitrogen plasma by the RF discharge in the pretreatment step in this embodiment.

The pretreatment for the substrate 11 with plasma is preferably a plasma treatment which is carried out in an atmosphere containing an ion component and a radical component having no charge, similar to the sputter cleaning.

In order to remove contaminations from the main surface 11 of the substrate 11, when only the ion component is exposed to the substrate 11, the applied energy to the main surface 11a is too large. Due to this, the main surface 11a may be damaged, and quality of crystals growing on the substrate 11 may decrease.

In this embodiment, it is possible to remove the contamination without damage of the main surface 11a by the plasma treatment in the atmosphere containing the ion component and the radical component to expose the reaction species having appropriate energy to the substrate 11, as the pretreatment step for the main surface 11a of the substrate 11. The mechanism for obtaining these effects by the plasma treatment to the substrate 11 is unclear. However, the damage to the surface of the substrate 11 may be prevented by using plasma containing a small amount of the ion component, and the contamination attached on the surface of the substrate 11 may be effectively removed by applying plasma to the surface of the substrate 11.

Moreover, it is more preferable that the substrate 11 be subjected to a wet pretreatment prior to the pretreatment with plasma.

In this embodiment, after the substrate 11 is subjected to the plasma treatment in the pretreatment step, the buffer layer 12 made of the group III nitride in the buffer layer formation step, which is explained below, and the n-type semiconductor layer 14 having the base layer 14a is formed on the buffer layer 12. Thereby, the crystallinity of the semiconductor layer 20 made of the group III nitride semiconductor is remarkably improved. Due to this, the light-emitting properties of the light-emitting device are also improved.

As explained above, the mechanism for improving the crystallinity of the semiconductor layer 20 by the plasma treatment to the substrate 11 may be that the main surface 11a of the substrate 11 is exposed by removing the contamination on the substrate 11 by sputter cleaning, and the lattice structure of the crystals between the substrate 11 and the group III nitride is matched.

In addition, according to the pretreatment step in this embodiment, it is possible to prevent the surface of the substrate 11 becoming damaged, dissimilar to bombardment method in which contamination on the substrate is removed by physical impact using Ar gas, etc.

[Buffer Layer Formation Step]

As explained above, the buffer layer 12 having a composition represented by $Al_xGa_{1-x}N$ (0≤x<1) is formed by activating with plasma and reacting at least a metal gallium raw material and a gas containing a group V element in the present invention. In this embodiment, a method in which the buffer layer 12 is formed by the reactive sputtering method discharging by high voltage under a specific vacuum degree is explained.

Examples of a method for producing a layer by activating with plasma and reacting the metal raw material and a raw material gas include the MOCVD method; a pulse laser deposition method (PLD method), in which plasma is generated by irradiating a laser having a high energy density; a pulsed electron beam deposition method (PED method) in which plasma is generated by irradiating an electron beam, in addition to the reactive sputtering method. The method can be arbitrarily used. Among these, the reactive sputtering method is simple and suitable for commercial production. Therefore, the reactive sputtering method is preferable.

In this embodiment, after the main surface 11a of the substrate is pretreated as explained above, the gas containing nitrogen as the group V element, and argon gas are introduced into a chamber 41 in a sputtering device 40 (shown in FIG. 7), then the substrate 11 is heated around 500° C. While applying high frequency bias toward the substrate 11, power is applied toward a Ga target containing metal Ga as the raw group III metal to generate plasma in the chamber 41. While maintaining the pressure in the chamber 41, the buffer layer 12 made of GaN is formed on the substrate 11.

[Sputtering Device: Layer Formation Device]

Figure 7:
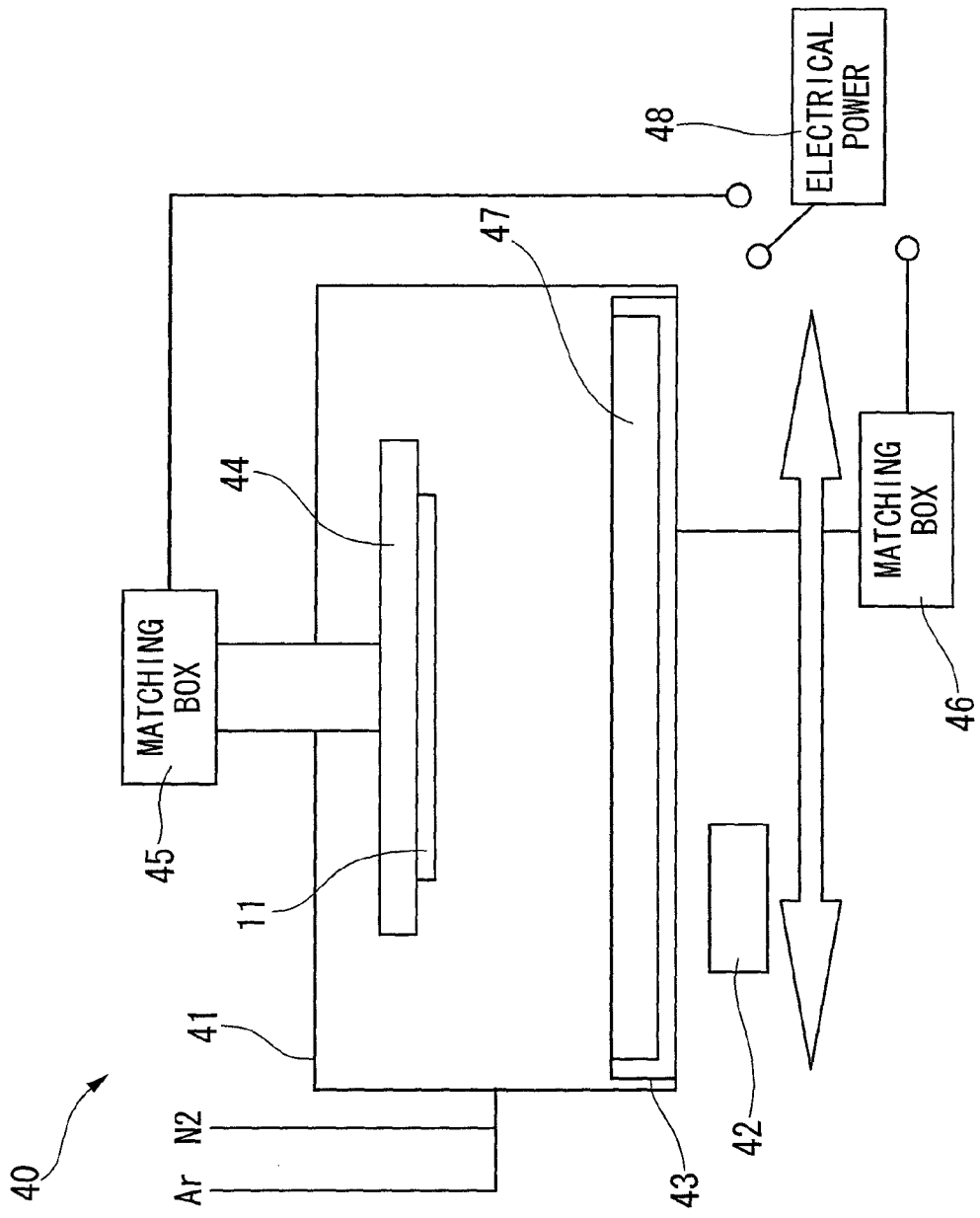
FIG. 7 is a view explaining one example of the method for producing the group III nitride semiconductor light-emitting device according to the present invention, and specifically a view showing a sputtering device in which a target is provided in the chamber.

In the sputtering device 40 shown in FIG. 7, a magnet 42 is positioned under (lower direction in FIG. 7) a target 47 containing the metal. The magnet 42 is swung under the target 47 by the drive unit, which is not shown in FIG. 7. Nitrogen gas and argon gas are supplied into the chamber 41. Thereby, the buffer layer is formed on the substrate 11 on a heater 44. While forming the buffer layer, since the magnet 42 is swung under the target 47, the plasma enclosed in the chamber 41 moves. Due to this, it is possible to form evenly the buffer layer on the side surfaces 11b, in addition to the main surface 11a of the substrate 11.

Examples of the reactive sputtering method for forming the buffer layer 12 include the RF sputtering method (Radio Frequency Sputtering), and the DC sputtering method (Direct Current Sputtering). When the buffer layer is formed by the reactive sputtering method using nitrogen gas as the gas containing nitrogen (that is, the gas containing the group V element) similar to the present invention, it is well known that nitrogen adsorbs to the surface of the target (metal material) (Mat. Res. Soc. Symp. Proc. Vol. 68, 357, 1986). In general, when the metal target is used to sputter, the DC sputtering method is preferable, from the viewpoint of layer formation efficiency. However, when the DC sputtering method which discharges continuously is used, nitrogen may adhere to the target and cause the charge up of the surface of the target (the surface of the target is electrically charged), and the layer formation rate may be unstable. Therefore, the RF sputtering method or the pulsed DC sputtering method, which can apply bias-like pulsing motion, are preferably used in the production method of the present invention among the RF sputtering methods and the DC sputtering methods. In addition, it is preferable to use a sputtering device which can carry out such a sputtering method.

When the buffer layer 12 is formed by the sputtering, it is preferable to use the reactive sputtering which flows the gas containing nitrogen into the reactor, because it is possible to control the reaction. Due to this, it is possible to maintain excellent crystallinity, and duplicate stably the excellent crystallinity. In addition, it is also preferable to use a sputtering device which can carry out such a reactive sputtering method. In general, the higher the purity of the target material, the better the layer properties of the obtained thin layer, such as crystallinity. When the buffer layer 12 is formed by sputtering, it is possible to sputter using plasma of an inert gas, such as Ar. However, the group III metal and the mixture thereof, which is used as the target in the reactive sputtering, can be highly purified, compared with the group III nitride semiconductor. Therefore, it is possible to further improve the crystallinity of the obtained base layer 14a in the reactive sputtering method.

It is preferable to move the cathode magnet within the target, in order to prevent the charge up. Specific movement can be selected depending on the sputtering device used. For example, it is possible to swing or rotate the cathode magnet.

In the sputtering device 40 shown in FIG. 7, the magnet 42 is arranged under the metal target 47. The magnet 42 rotates under the metal target 47.

In the reactive sputtering method, a technique for improving efficiency by blocking plasma in a magnetic field to increase the plasma density is generally used. In this case, in order to use evenly the target, it is preferable to use a device adopting the RF sputtering method, in which the layer is formed while moving the cathode magnet 42 within the target 47, similar to the sputtering device 40. The RF sputtering method for forming a layer while swinging or rotating the cathode magnet, which is explained in detail, is preferable, since the layer formation efficiency is high when the buffer layer 12 is formed on the side surfaces of the substrate 11.

In the detailed explanation shown below, it is preferable that as few impurities as possible remain in the chamber 41. In particular, it is preferable to decrease the amount of impurities attached to the inner wall of the chamber 41 as much as possible. Therefore, the ultimate vacuum in the chamber 41 which is determined depending on the ability of the sputtering device 40 is preferably $1.0 \times 10^{-3}$ Pa or less.

The buffer layer 12 is formed preferably so as to cover 90% or more of the main surface 11 of the substrate 11, more preferably so as to cover the entire main surface 11a of the substrate 11. In particular, it is most preferable that the buffer layer 12 be formed so as to cover the main surface 11a, the side surfaces 11b, and the back surface of the substrate 11.

However, when a conventional sputtering device and a conventional layer formation method are used to form the buffer layer to the side surfaces and back surface of the substrate 11, it is necessary to carry out the layer formation method up to 6 to 8 times, and this treatment requires a long period of time. A layer lamination method may be used for producing the buffer layer on the entire surface of the substrate 11 without supporting the substrate, in addition to this conventional method. However, the device may be complicated when the substrate is required to be heated.

Therefore, the buffer layer can be formed by changing the position of the substrate relative to the sputtering direction of the layer formation raw material, for example, by using the sputtering device which swings or rotates the substrate, as explained above, for example. When such a sputtering device and a layer formation method are used, the buffer layer can be formed on the main surface and the side surfaces of the substrate in only one step. After that, when the buffer layer is formed on the back surface of the substrate, the buffer layer can be formed on the entire surfaces of the substrate in only two steps.

In addition, the sputtering device may be a device in which the buffer layer can be formed on the entire surface of the substrate without moving the substrate by making an area of the generation source (target) of the layer material large, and moving the position of the generation source. As one example of such a sputtering device, the sputtering device 40 shown in FIG. 7 can be exemplified. The sputtering device shown in FIG. 7 uses the RF sputtering method in which a layer is formed by swinging or rotating the magnet, and thereby moving the position of the cathode magnet within the target. When the buffer layer is formed by the RF sputtering method, a device which moves both of the substrate and the cathode can also be used. In addition, the buffer layer can be formed simultaneously on both of the main surface and side surfaces of the substrate by arranging the cathode (a target plate 43 in FIG. 7), which is the generation source of the material, near the substrate and supplying plasma to the substrate so as to cover the substrate not supplying the plasma in a beam shape.

[Group V Element: Gas Atmosphere Containing a Nitrogen Element]

As the gas containing the group V element used in the present invention, a gas containing nitrogen is preferably used. Any well-known nitrogen compound can be used without limitations. However, ammonia and nitrogen ($N_2$) are preferable, because they are easily obtained at comparatively low price, and are easy to handle. Ammonia has improved decomposition efficiency, and can form the base layer 14a with a high growth rate. However, ammonia has high reactivity and toxicity. Therefore, it is necessary to provide toxic material elimination equipment or a gas detector. It is also necessary to make the reaction apparatus with materials which have high chemical stability.

When nitrogen ($N_2$) is used as a raw material, a simple apparatus can be used. However, a high reaction rate is not obtained. However, when nitrogen is introduced into the apparatus after decomposition by electrical field or heat, a layer formation rate which is lower than that of ammonia but sufficient in industrial production can be achieved. Therefore, when the cost of the apparatus and the industrial production are concerned, nitrogen is the most preferably used as a nitrogen source.

The temperature, pressure, and the nitrogen percentage can be listed as the important factors for forming the buffer layer 12 by the reactive sputtering method. For example, when nitrogen ($N_2$) is used as the gas containing nitrogen element, the nitrogen flow rate relative to the flow of nitrogen and argon gas (Ar) is preferably in a range of 20% to 100%. When the percentage of nitrogen is 20% or less, the amount of nitrogen is small, and metal is deposited on the substrate 11, and the buffer layer 12 having a desired crystal structure of the group III nitride cannot be obtained.

In this embodiment, the migration on the substrate 11 can be prevented by supplying the active nitrogen reactive species on the substrate with high concentration. Thereby, self-organization of the buffer layer 12 can be prevented, and the buffer layer 12 can have an appropriate single crystal structure. It is also possible to suitably control the crystallinity of the semiconductor layer made of the group III nitride semiconductor, which is formed on the buffer layer 12, by controlling appropriately the texture of the single crystal structure of the buffer layer 12.

[Temperature of the Substrate]

When the buffer layer is formed, the temperature of the substrate 11 is preferably in a range of room temperature to 1,000° C., and more preferably in a range of 200° C. to 800° C. When the substrate temperature is less than the minimum of the range, it is impossible to cover the entire main surface 11a of the substrate 11 with the buffer layer 12, and the main surface 11a may be exposed. In contrast, when the substrate temperature exceeds the maximum of the range, the metal raw material actively migrates on the substrate 11, and the preferable buffer layer is not obtained.

Moreover, "room temperature" is influenced by the conditions in the steps, but it means a temperature in a range of 0° C. to 30° C. in the present invention.

[Pressure in the Chamber]

When the buffer layer 12 is formed using the reactive sputtering method, the pressure in the chamber is preferably 0.3 Pa or more. When it is less than 0.3 Pa, the amount of kinetic energy of the generated reactive species is too large, and the quality of the buffer layer formed is inferior. The upper limit of the pressure in the chamber is not particularly limited. However, when it is 0.8 Pa or more, the dimer charged particles, which contribute to the orientation in the layer, are influenced with interaction of charged particles in plasma. Therefore, the pressure in the chamber 41 is preferably in a range of 0.3 Pa to 0.8 Pa.

[Ultimate Vacuum Degree in the Sputtering Device]

In the production method of the present invention, it is preferable that the ultimate vacuum degree in the chamber 41 of the sputtering device 40 for forming the buffer layer 12 be $1.0 \times 10^{-3}$ Pa or less, and after adjusting the vacuum degree in the chamber 41, the buffer layer be made.

As explained above, when the buffer layer 12 is formed by the reactive sputtering method, there is a concern that impurities attached to the inner wall of the chamber 41 of the sputtering device 40 are hit with plasma and pushed out from the inner wall, and contaminate the buffer layer 12 on the substrate 11. It can be thought that the impurities in the chamber 41 are mainly generated by oxygen, moisture, and other components in the air entering the chamber 41 and attaching to the inner wall when the chamber 41 is opened to be subjected to maintenance.

Therefore, it is preferable that the ultimate vacuum degree in the chamber 41 be adjusted to $1.0 \times 10^{-3}$ Pa or less to decrease the amount of the impurities, and then the buffer layer 12 be made. Due to this, it is possible to prevent the contamination of the impurities, such as oxygen, and moisture, etc. in the air into the buffer layer 12, and to form the buffer layer 12 having excellent orientation and crystallinity.

In addition, the buffer layer 12 is preferably formed in the chamber 41 of the sputtering device 40 having the ultimate vacuum degree of $3.5 \times 10^{-5}$ Pa or less, and more preferably $6.0 \times 10^{-6}$ Pa or less.

[Layer Formation Rate]

The formation rate of the buffer layer 12 is preferably in a range of 0.01 nm/s to 10 nm/s. When the formation rate is less than 0.01 nm/s, the buffer layer 12 is formed like dots on the substrate 11, not formed like a layer, and the buffer layer 12 may not cover the substrate 11. In contrast, when it exceeds 10 nm/s, the buffer layer 12 is not crystal, and is amorphous.

[Target]

When mixed crystal is formed as the buffer layer using the reactive sputtering method which activates the metal Ga raw material and the gas containing nitrogen element with plasma, a metal mixture containing Ga (the mixture may be an ally or not) may be used as the target. In addition, a method, in which two targets, which are different materials, are sputtered at the same time, may also be used. When the layer having a fixed composition is formed, the target which is a mixture of metals may be used. In contrast, when several layers having different compositions are formed, several targets may be arranged in the chambers.

According to the buffer layer formation step in this embodiment, the buffer layer 12 is formed on the substrate 11, which is pretreated with plasma in the pretreatment step, by the reactive sputtering method. Therefore, the lattice mismatch does not occur between the buffer layer 12 made of the group III nitride semiconductor crystal and the substrate 11, and the buffer layer 12 having excellent crystallinity can be stably obtained.

[Formation of the Semiconductor Layer]

The semiconductor layer 20 is formed on the buffer layer 12 which is formed as explained above, by forming the n-type semiconductor layer 14, the light-emitting layer 15, and the p-type semiconductor layer 16 in this order. In the production method in this embodiment, as explained above, after the base layer 14a of the n-type semiconductor layer 14 is formed by the MOCVD method, each of the n-type contact layer 14b, the n-type clad layer 14c, the light-emitting layer 15, and the p-type semiconductor layer 16 can also be formed by the MOCVD method.

In this embodiment, the growth method of the gallium nitride-based semiconductor (group III nitride semiconductor) for the semiconductor layer 20 is not particularly limited. Examples of the growth methods include any methods which can grow nitride semiconductors, such as the sputtering method, the HVPE method (hydride vapor phase epitaxial method), and the MBE method (molecular beam epitaxial method), in addition to the MOCVD method (metalorganic chemical vapor deposition method) which is explained above. In the MOCVD method, hydrogen ($H_2$) or nitrogen ($N_2$) is used as a carrier gas; trimethylgallium (TMG) or triethylgallium (TEG) is used as a source of Ga which is a group III material source; trimethylaluminum (TMA) or triethylaluminum (TEA) is used as a source of Al; trimethylindium (TMI) or triethylindium (TEI) is used as a source of 1$n$; ammonia ($NH_3$), or hydrazine ($N_2H_4$), etc. is used as a source of N which is the group V material source. In addition, examples of the n-type dopant include monosilane ($SiH_4$) or disilane ($Si_2H_6$) as a source of Si, and organic germanium compounds, such as germane gas ($GeH_4$), tetramethyl germanium (($CH_3$)$_4$Ge), or tetraethyl germanium (($C_2H_5$)$_4$Ge) as a germanium raw material.

In the MBE method, a germanium element can also be used as a source of the doping. Examples of the p-type dopant include biscyclopentadienyl magnesium ($Cp_2Mg$) and bis-ethylcyclopentadienyl magnesium ($EtCp_2Mg$) as a source of Mg.

The gallium nitride-based semiconductor can contain the group III elements other than Al, Ga, and In. Specifically, the gallium nitride semiconductor can contain Ge, Si, Mg, Ca, Zn, and/or Be, if necessary. Furthermore, the GaN semiconductor may contain not only the elements which are intentionally added but also impurities which are inevitably contained depending on the lamination conditions, or trace impurities which are contained in a raw material and reaction pipe, and the like.

[Formation of N-Type Semiconductor Layer]

When the semiconductor layer 20 is formed in this embodiment, first, the base layer 14$a$ of the n-type semiconductor layer 14 is laminated on the buffer layer 12 by a well-known MOCVD method. Then, the n-type contact layer 14$b$, and the n-type clad layer 14$c$ are formed on the base layer by the MOCVD method.

The base layer 14$a$, the n-type contact layer 14$b$, and the n-type clad layer 14$c$ can be formed by using the same MOCVD device. In addition, it is also possible to form the light-emitting layer 15, which is explained below, using the same MOCVD device. In this case, in order to form each layer, conditions of the MOCVD device are suitably changed.

Moreover, each layer of the n-type semiconductor layer 14 is formed by the MOCVD method in this embodiment. However, it is also possible to form these layers by the reactive sputtering method. In this case, for example, the sputtering device 40 shown in FIG. 7, which is used for forming the buffer layer 12, may be used, and the conditions for forming a layer, such as the material of the target and the gas atmosphere in the chamber may be changed to form these layers.

[Base Layer Formation Step]

In the base layer formation step in this embodiment, the base layer 14$a$, which is the lowest layer of the n-type semiconductor layer 14, is formed on the buffer layer 12, which is formed on the main surface 11$a$ of the substrate 11 in the buffer layer formation step, by a well-known MOCVD method.

Any gas can be used as the carrier gas which flows into the reaction furnace in the base layer formation step without limitation. Hydrogen, nitrogen, etc. which can widely used as vapor chemical deposition methods such as the MOCVD method, can also be used. However, when hydrogen is used as the carrier gas, and the temperature is increased in relatively active hydrogen, there is a possibility that the crystallinity and flatness of the crystal surface may be deteriorated. Therefore, the treatment time is preferably short.

Any crystal growth method can be used to form the base layer 14$a$ in the base layer formation step as long as it generates a loop of the dislocation. In particular, the MOCVD method, the MBE method, and the VPE method generate migration. Due to this, it is possible to form the base layer having excellent crystallinity. Therefore, these methods are preferable. Among these methods, the MOCVD method is more preferable, because it can provide the base layer having the most excellent crystallinity.

When the base layer 14$a$ is formed by the MOCVD method, the pressure in the growth furnace is preferably adjusted to a range of 15 kPa to 40 kPa.

It is also possible to form the base layer made of the group III nitride semiconductor by the reactive sputtering method. In this case, the device used can be simple, compared with the MOCVD method and the MBE method. In addition, when the base layer is formed by the reactive sputtering method which flows the group V element material into the reactor, the target having high purity can be used. Therefore, the base layer having excellent crystallinity can be formed.

The temperature of the substrate 11 when the base layer 14 is formed, that is, the growth temperature of the base layer 14$a$ is preferably 800° C. or more, more preferably 900° C., and most preferably 1,000° C. or more. When the temperature of the substrate 11 during the formation of the base layer 14 is higher, atoms easily migrate, and the dislocation loop is easily achieved. It is necessary that the substrate temperature, when the base layer 14$a$ is formed, be less than the decomposition temperature of the crystal. Therefore, the temperature of the substrate 11 is preferably less than 1,200° C. When the temperature of the substrate 11 during the formation of the base layer 14$a$ is in the range, the base layer 14$a$ having excellent crystallinity can be obtained.

Moreover, it is preferable that the buffer layer 12 be treated with heat before forming the base layer 14$a$ made of the gallium nitride-based semiconductor on the buffer layer 12 made of GaN formed by sputtering in the production method of this embodiment. It is possible to sublimate phases having lower crystallinity in the buffer layer 12 by this heat treatment. This heat treatment can be carried out by exposing the buffer layer 12 at temperatures in a range of 500° C. to 1,000° C. for 1 minute to 120 minutes. While the heat treatment, the temperature may be fixed or may be varied gradually. In addition, the atmosphere gas during the heat treatment contains preferably a reactive gas, for example, hydrogen, and ammonia. Furthermore, when organic metal is contaminated in the atmosphere gas, crystals grow. Therefore, organic metal in the atmosphere gas is not preferable.

[Formation of Light-Emitting Layer]

The light-emitting layer 15 is formed by a conventional MOCVD method on the n-type clad layer 14$c$.

The light-emitting layer 15 shown in FIG. 1 has a laminate structure in which the bottom and upper layers of the light-emitting layer 14 are barrier layers made of GaN, and include seven-barrier layers 15$a$ made of GaN and six well layers 15$b$ made of undoped $Ga_{0.92}In_{0.08}N$, which are alternately laminated.

In addition, it is possible to use the same MOCVD device as that used to form the n-type semiconductor layer 14 by changing the layer formation conditions, in order to form the light-emitting layer 15.

[Formation of P-Type Semiconductor Layer]

The p-type semiconductor layer 16 including the p-type clad layer 16a, and the p-type contact layer 16b is formed by the MOCVD method on the light-emitting layer 15, that is, on the barrier layer 15a which is the upper layer of the light-emitting layer 15. It is possible to use the same MOCVD device as that used to form the n-type semiconductor layer 14 or the light-emitting layer 15 by changing the layer formation conditions, in order to form the p-type semiconductor layer 16.

In addition, it is also possible to form the layers of the p-type semiconductor layer 16 by the reactive sputtering method. In this case, for example, the p-type semiconductor layer 16 can be formed by using the sputtering device 40 shown in FIG. 7, and suitably changing the conditions for forming a layer, such as, the material of the target and the gas atmosphere in the chamber used to form these layers.

In order to form the p-type semiconductor layer 16, first, the p-type clad layer 16a made of $Al_{0.1}Ga_{0.9}$ doped with Mg is formed on the light-emitting layer 15 (that is, the barrier layer 15a, which is the upper layer of the light-emitting layer 15). Then, the p-type contact layer 16b made of $Al_{0.02}Ga_{0.98}$ doped with Mg is formed on the p-type clad layer 16a. During forming the p-type clad layer 16a and the p-type contact layer 16b, it is possible to use the same MOCVD device.

Moreover, for example, not only Mg, but also zinc (Zn), etc. can be used as the p-type impurity, as explained above.

[Formation of Transparent Anode]

The transparent anode 17 made of ITO is formed on the p-type contact layer 16b of the laminate semiconductor 10 including the layers formed by the above-mentioned method.

The formation method for the transparent anode 17 is not particularly limited, and a well-known method in this technical field can be used. In addition, the structure of the transparent anode 17 can be any structure including conventional well-known structures without limitations.

The material for the transparent anode 17 is not limited to ITO, and AZO, IAO, GZO, etc. can also be used.

After forming the transparent anode 17, thermal annealing may be performed to alloy or make it transparent. However, the thermal annealing may not be performed.

[Formation of Anode Bonding Pad and Cathode]

The anode bonding pad 18 is further formed on the transparent anode 17 on the laminate semiconductor 10.

For example, the anode bonding pad 18 can be formed by laminating Ti, Al, and Au on the transparent anode 17 in this order by a conventional lamination method.

When the cathode 19 is formed, first, a part of the p-type semiconductor 16 on the substrate 11, the light-emitting layer 15, and the n-type semiconductor layer 14 is removed to form an exposed area 14d (shown in FIGS. 2 and 3) in the n-type contact layer 14b, and then the cathode bonding pad 19 is formed on the exposed area 14d.

Then, Ni, Ai, Ti, and Au are laminated on the exposed area 14d in this order using a well-known method. Thereby, a cathode bonding pad 19 having a four-layer structure, which is not shown in figures in detail, can be formed.

Then, the back surface of the substrate of the wafer in which the transparent anode 17, the anode bonding pad 18, and the cathode 19 are formed on the laminate semiconductor 10, which is obtained as explained above, is ground and polished. Thereby, the back surface of the wafer becomes a mirror. After that, for example, the wafer is cut so as to be 350 μm×350 μm to obtain the light-emitting chip (light-emitting device 1).

As explained above, the method for producing a group III nitride semiconductor light-emitting device of the present invention includes a pretreatment step in which the substrate is treated with plasma; a buffer layer formation step in which the buffer layer having a composition represented by $Al_xGa_{1-x}N$ ($0 \leq x < 1$) is formed on the pretreated substrate by activating with plasma and reacting at least a metal gallium raw material and a gas containing a group V element; and a base layer formation step in which the base layer is formed on the buffer layer. Therefore, the buffer layer 12, which has excellent uniformity and is highly orientated, can be formed. In addition, since the base layer 14a having excellent crystallinity can be formed on the buffer layer 12, lattice mismatch does not occur between the substrate 11 and the semiconductor layer 20 made of the group III nitride semiconductor. Consequently, it is possible to grow the group III nitride semiconductor having excellent crystallinity on the substrate 11 with high efficiency. Due to this, it is also possible to produce the group III nitride semiconductor light-emitting device 1 having excellent light-emitting properties with high productivity.

[Another Group III Nitride Semiconductor Light-Emitting Device]

In the light-emitting device 1 explained above, as shown in FIGS. 2 and 3 (as well as the laminate semiconductor 10 shown in FIG. 1), the main surface 11a of the substrate 11 consists of a flat (0001) C-plane. However, the present invention is not limited to this embodiment. For example, as shown in FIGS. 4A, 4B, and 4C, the upper surface of the substrate where the buffer layer is formed may have convex portions.

Figure 4A:
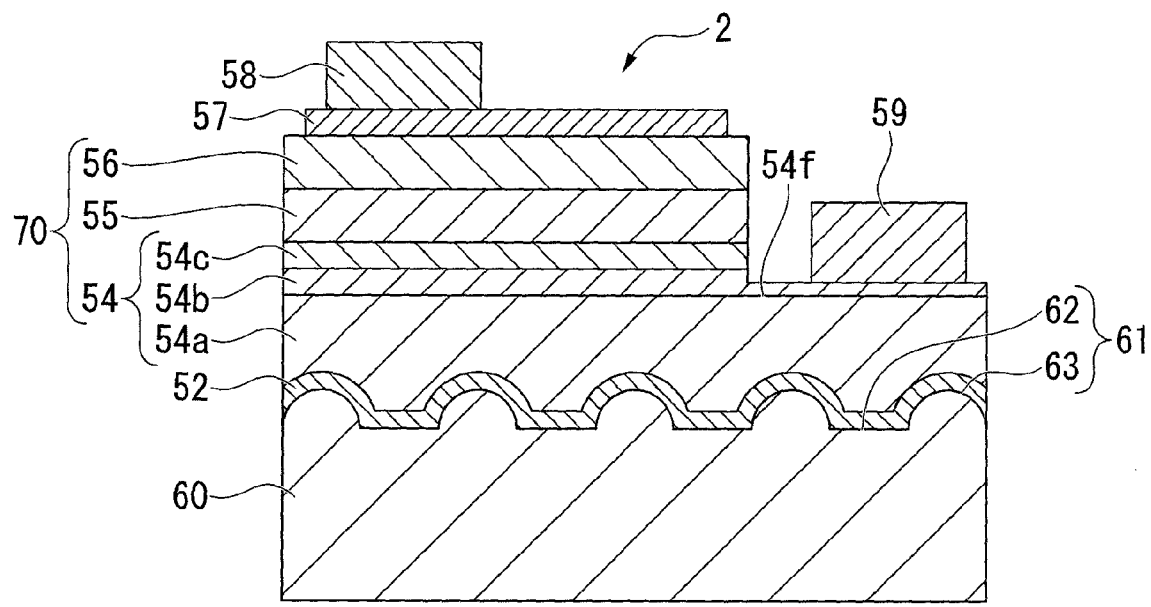
FIG. 4A is a view showing one example of the group III nitride semiconductor light-emitting device according to the present invention, and specifically a sectional view showing a light-emitting device in which the buffer layer and the semiconductor layer are formed on the upper surface having convex portions of the substrate.
Figure 4B:
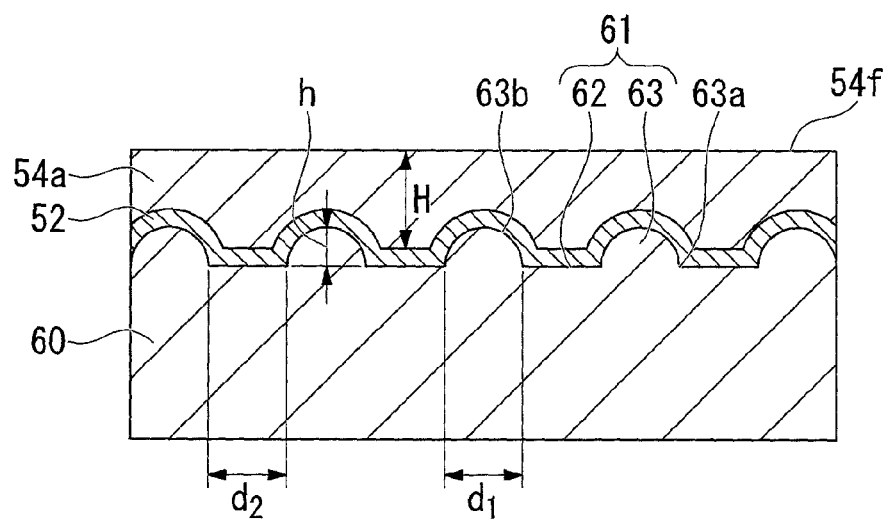
FIG. 4B is a view showing one example of the group III nitride semiconductor light-emitting device according to the present invention, and specifically a sectional view showing the lower position of the light-emitting device shown in FIG. 4A.

As shown in the partial sectional view of FIG. 4B (as well as FIG. 4C), the light-emitting device 2 shown in FIG. 4A has plural convex portions 63 on the substrate 60. The main surface 61 where the convex portions 63 are not formed is a flat surface 62 which is the (0001) C-plane. In other words, the main surface 11a of the substrate 11 includes the flat surface 62 which is the (0001) C-plane and plural convex portions 63. In this embodiment, the buffer layer 52 is formed so as to fill the intervals between the convex portions and cover the entire main surface 61 including the convex portions 63; the base layer 54a, which is made of the group III nitride semiconductor, and constitutes the semiconductor layer 70, is formed on the buffer layer 52; and the layers of the semiconductor layer 70 are formed on the base layer 54a.

Figure 4C:
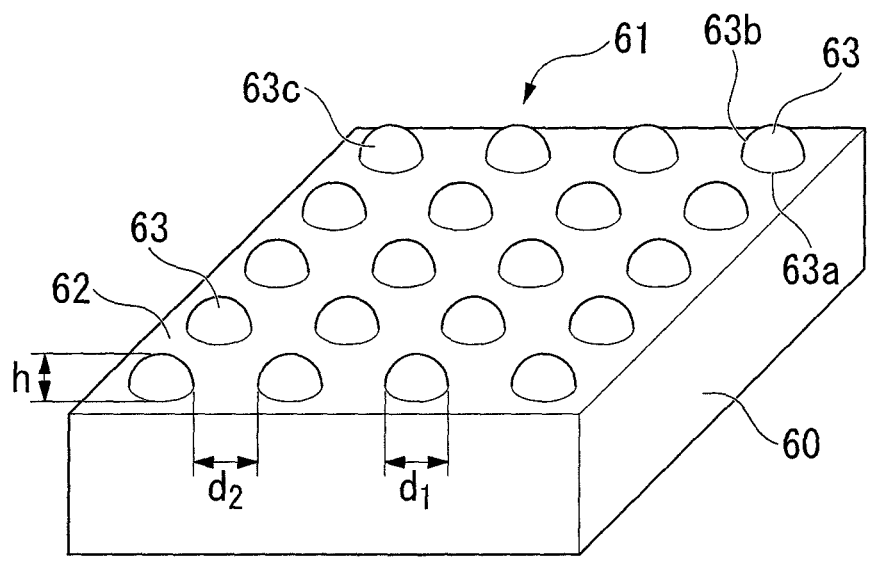
FIG. 4C is a view showing one example of the group III nitride semiconductor light-emitting device according to the present invention, and specifically a perspective view showing the shape of the substrate.

The semiconductor layer 70 in the light-emitting device 2, shown in FIGS. 4A through 4C, includes the n-type semiconductor 54, which has the base layer 54a, the n-type semiconductor layer 54, and the n-type clad layer 54c; the light-emitting layer 55; and the p-type semiconductor layer 56. In addition, the transparent anode 57 is formed on the semiconductor layer 70, and the anode bonding pad 58 is formed on the transparent anode 57. The cathode 59 is formed on the n-type contact layer 54b of the n-type semiconductor layer 54.

Moreover, the light-emitting device 2 in this embodiment can be produced in the same manner using the same material as those of the light-emitting device 1, except to form the substrate 60 so as to include the convex portions 63 explained above, and form the buffer layer 52 so as to cover the main surface 61 including the flat surface 62 and the convex portions 63, and form the base layer 54a on the buffer layer 52.

In this embodiment, it is possible to improve the internal quantum efficiency and light extracting efficiency of the light-emitting device by having the convex portions on the upper surface of the substrate and forming the buffer layer so as to cover the upper surface of the substrate. Moreover, the reasons for obtaining these effects are explained below.

First, the light-emitting device 2 shown in FIGS. 4A, 4B, and 4C, and the substrate 60 are explained in detail.

[Shape of Substrate]

The convex portion 63 has the surface 63c which is non-parallel to the C-plane, as shown in FIGS. 4B and 4C. The surface 63c is not the C-plane. In the convex portion 63 shown in FIGS. 4B and 4C, the planar shape at the base portion 63 is substantially circular, and the external form becomes gradually smaller toward the top of the convex portion 63. In addition, the side surface 63a of the convex portion 63 is curved so as to protrude toward the outside. In other words, the convex portion 63 is semispherical. In addition, the convex portions 63 are arranged with a fixed interval in a grid shape, as shown in FIGS. 4B and 4C.

The convex portions shown in FIGS. 4B and 4C have the width ($d_1$) of the base portion in a range of 0.05 μm to 5 μm, the height (h) in a range of 0.05 μm to 5 μm, the height is ¼ or more relative to the width ($d_1$) of the base portion, and the interval ($d_2$) between adjacent convex portions is 0.5 to 5 times the width ($d_1$) of the base portion. Here, the width ($d_1$) of the base portion means the largest width at the base (base portion 63a) of the convex portion 63. The interval ($d_2$) between the adjacent convex portions means the distance between edges of the base portion 63 of the adjacent convex portions 63.

It is preferable that the interval ($d_2$) between adjacent convex portions 63 be in a range of 0.5 to 5 times the width ($d_1$) of the base portion.

When the interval ($d_2$) between the convex portions 63 is less than 0.5 times the width ($d_1$) of the base portion, the crystal growth from the flat surface 62, which is the C-plane, is rarely promoted while epitaxially growing the base layer 54a of the semiconductor layer 70. Thereby, it becomes difficult to completely cover the convex portions 63 with the base layer 54a, and sufficient flatness of the surface 54 of the base layer 54a may not be obtained. Therefore, when crystals are grown as the semiconductor layer having a LED structure on the base layer 54, which fills the intervals between the convex portions 63, the crystals have many pits. This leads to a decrease of output power and deterioration of the electric properties of the group III nitride semiconductor light-emitting device to be formed.

In contrast, when the interval ($d_2$) between the convex portions 63 exceeds 5 times the width ($d_1$) of the base portion, and the group III nitride semiconductor light-emitting device is produced using this substrate 60, the frequency of light diffusion reflection at the interface between the substrate 60 and the group III nitride semiconductor layer formed on the substrate decreases. Thereby, the light extracting efficiency may be sufficiently improved.

It is preferable that the width ($d_1$) of the base portion be adjusted in a range of 0.05 μm to 5 μm. When the width ($d_1$) of the base portion is less than 0.05 μm and the group III nitride semiconductor light-emitting device is produced using the substrate 60, sufficient light diffusion reflection effects may not be obtained. In contrast, when the width ($d_1$) of the base portion exceeds 5 μm, it is difficult to epitaxially grow the base layer 54a so as to fill the intervals between the convex portions 63 and cover the entire main surface 61 including the convex portions 63.

It is preferable that the height (h) of the convex portion 63 be adjusted to a range of 0.05 μm to 5 μm. When the height (h) of the convex portions 63 is less than 0.05 μm and the group III nitride semiconductor light-emitting device is produced using the substrate 60, sufficient light diffusion reflection effects may not be obtained. In contrast, when the height (h) of the convex portions 63 exceeds 5 μm, it is difficult to epitaxially grow the base layer 54a so as to fill the intervals between the convex portions 63 and cover the entire main surface 61 including the convex portions 63. Thereby, sufficient flatness of the surface 54a of the base layer 54 may not be obtained.

It is preferable that the height (h) of the convex portion 63 relative to the width ($d_1$) of the base portion be ¼ or more. When the height (h) of the convex portion 63 is less than ¼ of the width ($d_1$) of the base portion, and the group III nitride semiconductor light-emitting device is produced using the substrate 60, sufficient light diffusion reflection effects may not be obtained. The light extracting efficiency may not be sufficiently improved.

Moreover, the shape of the convex portion 63 is not limited to that shown in FIGS. 4B and 4C. Any shape can be adopted as long as the shape has a nonparallel surface to the C-plane. For example, the convex portion 63 may have a shape in which a planar shape of the base portion is substantially polygonal, and the external shape becomes sharpened toward the top of the convex portion, and the side surface 63b curves so as to protrude toward the outside. In addition, the convex portion 63 may also be substantially a circular cone shape or a polygonal cone shape in which the surface inclines and the external form becomes smaller toward the top of the convex portion. Furthermore, the inclined angle of the surface may be changed in two phases.

The planar arrangement of the convex portions 63 is not limited to that shown in FIGS. 4B and 4C. The convex portions 63 may or may not be positioned so as to have a regular distance. In addition, the convex portion 63 may be positioned so as to make a square, triangle, or random shape.

[Processing Step for Substrate (Formation Method of Irregularity in the Surface of the Substrate)]

The production method in this embodiment includes a substrate processing step in which irregularity which is formed by the flat surface 62 and the convex portions 62 is formed in the substrate 60, before the pretreatment step in which the substrate is treated with plasma.

In the processing step for the substrate, the convex portions 63 can be formed on the substrate 60 by etching the substrate 60. However, the method for forming an irregularity on the surface of the substrate is not limited to etching. For example, the convex portions 63 can be formed by depositing a different material from the substrate 60 on the substrate 60. The method for depositing the different material for the convex portion from the material of the substrate may be the sputtering method, the vapor deposition method, the CVD method, etc. The material for the convex portions 63 is preferably a material which has a refraction index substantially equal to that of the substrate. Specifically, when the substrate is made of sapphire, $Al_2O_3$, $SiN$, $SiO_2$, etc. can be used.

[Formation of Buffer Layer and Base Layer (Semiconductor Layer)]

The buffer layer 52 is formed by the same method as that of the buffer layer 12 in the light-emitting device 1 so as to fill the intervals between the convex portions 63 and cover the entire surface 61 of the substrate 60.

Then, the base layer 54a made of a single crystal of the group III nitride semiconductor is epitaxially grown on the buffer layer 52 by the MOCVD method. During this process, the crystal does not grow from the convex portions 63 which have the surface 63c nonparallel to the C-plane of the substrate 60. The crystal orientated in the C-axial direction grows only from the flat surface 62, which is the C-plane. Due to this, crystal faults, such as dislocation, rarely occur in the crystal of the base layer 54a. The base layer 54a having excellent crystallinity can be formed in this embodiment.

For example, when there is a C-plane at the surface of the convex portion, and the group III nitride semiconductor layer made of a single crystal is formed on the substrate having the convex portions, the crystal grows from the C-plane at the surface of the convex portion and the surface of the substrate where the convex portions are not formed. In this case, crystal faults, such as dislocation, easily occur at locations where the crystal grown from the surface of the convex portions and the crystal grown from the substrate where the convex portions are not formed are bonded. Thus, it is difficult to produce the base layer 54a having excellent crystallinity. Such crystal faults negatively affect the crystallinity of the layers constituting the n-type semiconductor layer, the light-emitting layer, and the p-type semiconductor layer, which are formed on the base layer 54a. Due to this, the internal quantum efficiency may be decreased or leakage current may increase in the produced light-emitting device.

In contrast, the convex portions 63 having the surface which is not parallel to the C-plane are formed on the substrate 60 in this embodiment. In other words, the substrate 60 includes the main surface 61 having the flat surface 62, which is the C-plane, and the convex portions 63. Therefore, when the base layer 54a is epitaxially grown on the main surface 61, the crystal grows only from the flat surface 62. Thereby, the base layer 54a formed on the main surface 61 of the substrate 60 grows epitaxially so as to fill the interval between the convex portions 63 and cover the main surface 61. Due to this, crystal faults, such as dislocation, do not occur.

After that, when the LED (light-emitting device) is formed on the base layer 54 by forming the n-type semiconductor layer, the light-emitting layer, and the p-type semiconductor, the crystallinity of each layer is excellent. Thereby, the light-emitting device having excellent internal quantum efficiency and less light leakage can be produced.

In addition, as shown in FIGS. 4A, 4B, and 4C, the convex portions 63 are formed on the substrate 60 in this embodiment. That is, the interface between the substrate 60 and the buffer layer 52 has irregularity. This irregularity makes the interface between the substrate 60 and the semiconductor layer 70 (the base layer 54a) uneven. Due to this, it is possible to generate light-scattered reflection at the interface, and to produce the light-emitting device having higher light extraction efficiency.

[Lamp]

As explained above, a lamp can be produced by well know means in this technical field using the group III nitride semiconductor light-emitting device 1 according to the present invention and a phosphor. Various techniques for changing emission color by combining the light-emitting device 1 and phosphor are known. These techniques can be used without any limitations.

For example, it is possible to produce light having a wavelength which is larger than that of the light-emitting device by adequately selecting the phosphor. In addition, a lamp producing white light can be produced by mixing the emission wavelength of the light-emitting device and the wavelength which is changed by the phosphor.

The produced lamp can be used as an artillery shell type lamp which is commonly used, a side view type lamp which is used as the back light for portable phones, a top view type lamp which is used for displays, and the like.

Figure 5:
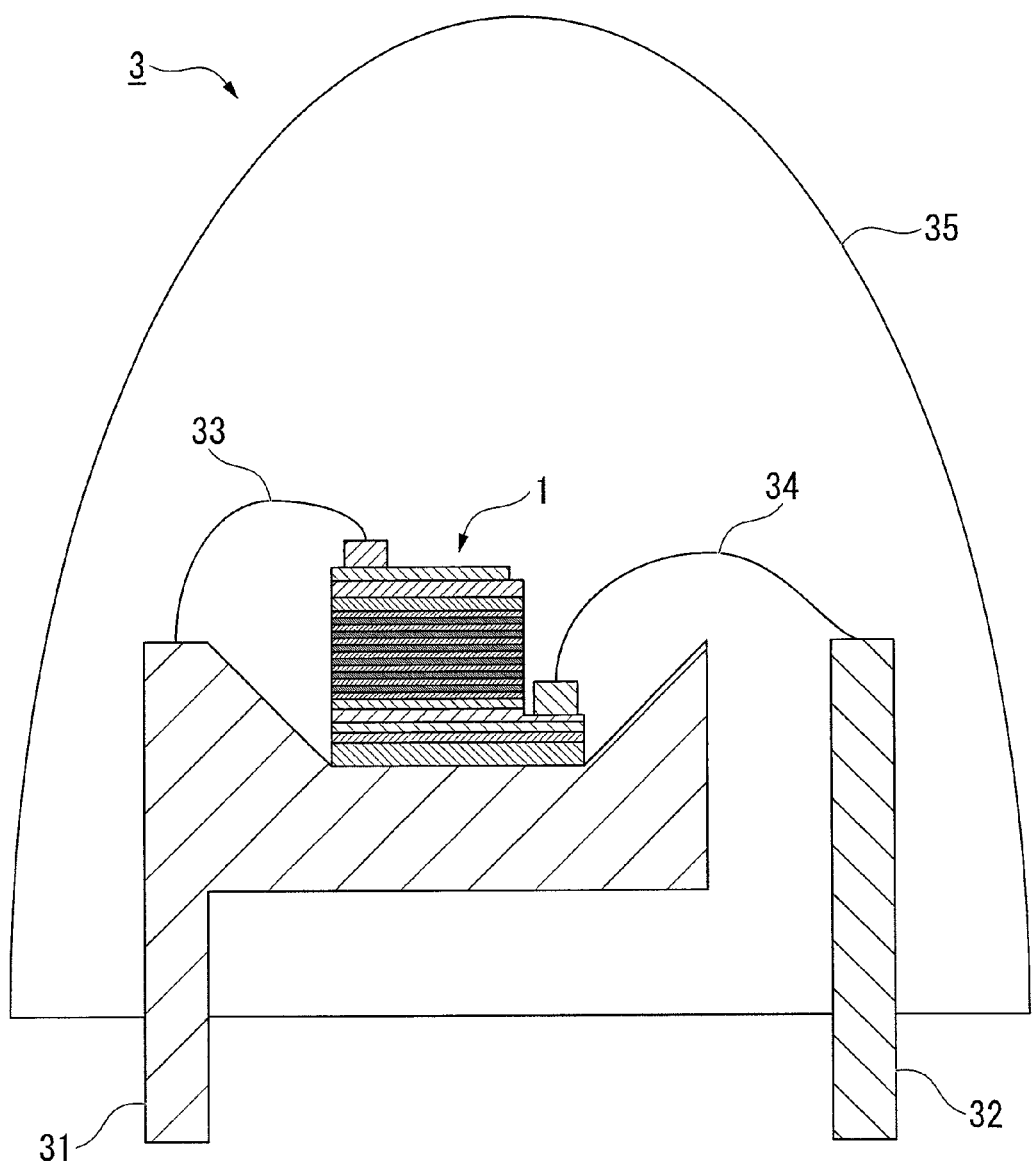
FIG. 5 is a sectional view showing the lamp provided with the group III nitride semiconductor light-emitting device according to the present invention.

For example, when the group III nitride semiconductor light-emitting device 1 having electrodes on the same side thereof is mounted in the artillery shell type lamp, as shown in FIG. 5, one (frame 31 in FIG. 5) of two frames is joined to the light-emitting device 1; the cathode 19 of the light-emitting device 1 is joined to the frame 32 with the wire 34; and the anode bonding pad 18 is joined to the frame 31 with the wire 33. Then, the exterior of the light-emitting device 1 is covered with the mold 35 made of a transparent resin. Thereby, the artillery shell type lamp 3 shown in FIG. 5 can be produced.

[Another Semiconductor Device]

The laminate structure of the group III nitride semiconductor having excellent crystallinity according to the present invention can be used for electrical devices, for example, photoelectricity transformation devices, such as solar cells, and light receiving elements, and electronic devices, such as HBTs (Heterojunction Bipolar Transistors) and HEMTs (High Electron Mobility Transistors), in addition to the light-emitting devices, such as a light-emitting diode (LED), and a laser diode (LD).

The semiconductor elements having various structures are well-known. The laminate structure of the group III semiconductor according to the present invention is only used in these elements. It is possible to use the laminate structure of the group III semiconductor according to the present invention in the various elements including well-known elements.

EXAMPLES

Next, the production method for a group III nitride semiconductor light-emitting device, and the group III nitride semiconductor light-emitting device, and the lamp, according to the present invention are explained in detail referring to Examples. However, the present invention is not limited only to the following Examples.

Example 1

The sectional view of the laminate semiconductor in the group III nitride semiconductor light-emitting device prepared in this Example is shown in FIG. 1. In this Example, the GaN single crystal layer was formed by the RF sputtering method as the buffer layer 12 on the C-plane of the substrate 11 made of sapphire. Then, a layer made of GaN (group III nitride semiconductor) was formed by the MOCVD method as the base layer 14a on the buffer layer 12. After that, the epitaxial wafer (laminate semiconductor) 10 having the epitaxial layer structure shown in FIG. 1 was produced by forming the layers constituting the semiconductor layer 20 on the base layer 14a.

[Formation of Buffer Layer]

First, the substrate made of a (0001) C-plane sapphire having a mirror-polished surface of which the diameter is 2 inches was introduced into the chamber. The device used was a sputtering device, which includes a high frequency power source, and moves the position of the magnet within the target, similar to the sputtering device 40 shown in FIG. 7. Metal Ga was used as the target.

The substrate 11 was heated to 750° C. in the chamber, and nitrogen gas was flowed into the chamber with a flow rate of 50 sccm. Then, the pressure in the chamber was maintained to 0.5 Pa. High frequency bias at 100 W was applied toward the substrate 11, and thereby the surface of the substrate 11 was cleaned by being exposed with nitrogen plasma.

Next, while maintaining the temperature of the substrate 11, argon and nitrogen gas were introduced into the sputtering device. Then, high frequency bias at 1,000 W was applied toward the metal Ga target, and the pressure in the chamber was maintained to 1.0 Pa. After that, the buffer layer 12 made of single crystal GaN was formed on the substrate 11 made of sapphire under conditions in which argon gas flew at 10 sccm and nitrogen gas flew at 30 sccm (the nitrogen ratio in the entire gas was 75%). The magnet within the target rotated when both cleaning the substrate 11 and forming the buffer layer.

Then, a layer made of GaN (the buffer layer 12) was formed in accordance with the layer formation rate (2.0 nm/s), which was previously measured, for a fixed time, plasma operation was stopped, and the temperature of the substrate 11 decreased.

After that, the X-ray rocking curve (XRC) of the buffer layer 12 formed on the substrate 11 was measured using a X-rays measuring device (Spectris Co., Ltd.; Model No. X'part Pro MRD). The measurement was carried out using a Cu—Kα ray-X ray generation source as the light source.

As a result, the XRC full width at half maximum at the (10-10) plane of the buffer layer 12 was 0.12 deg at the (0002) plane, and 1.4 to 5 deg at (10-10) plane. Thereby, it was confirmed that the buffer layer 12 was suitably orientated.

[Formation of the N-Type Semiconductor]

The substrate 11 on which the buffer layer made of GaN was formed was removed from the sputtering device, and put into the MOCVD device. Then, the n-type semiconductor layer 14 was formed on the buffer layer 12 as shown below.

The base layer 14a made of GaN was formed on the buffer layer 12 by the following steps. The MOCVD device used to form the base layer 14a was a conventional MOCVD device.

The substrate 11 was put into the MOCVD device. Specifically, the substrate 11 was arranged on a susceptor for heating made of carbon in a glove box inside which was substituted with nitrogen gas. Then, nitrogen gas inflew into a reaction furnace, the substrate 11 was heated by heater to 1,150° C. After confirming the temperature of the substrate 11 being stable at 1,150° C., ammonia gas was flowed into the reaction furnace by opening the valve for ammonia gas pipe.

Then, a gas containing hydrogen and TMG vapor was supplied into the MOCVD device to start the formation of the group III nitride semiconductor (GaN) as the base layer 14a on the buffer layer 12. During the formation, the amount of ammonia was adjusted such that the ratio of the group V element/group III element was 600. In this way, after growing GaN for 3 hours, the TMG pipe was closed to stop supply into the reaction furnace. Thereby, the growth of GaN was stopped. Then, the temperature of the substrate 11 was decreased to room temperature by stopping heating.

The base layer 14a made of undoped GaN having a thickness of 6 μm was formed on the buffer layer 12 made of single crystal GaN formed on the substrate, as explained above. The sample removed from the reaction furnace after formation was clear and colorless, and the surface of the GaN layer (base layer 14a) was a mirror surface.

After that, the X-ray rocking curve (XRC) of the base layer 14a made of undoped GaN obtained by these steps was measured using an X-ray measuring device (Spectris Co., Ltd.; Model No. X'part Pro MRD). The measurement was carried out at the (0002) plane which is a symmetrical plane and the (10-10) plane which is an unsymmetrical plane, using a Cu-β ray-X ray generation source as the light source. In general, the XRC full width at half maximum at the (0002) plane is an index of the surface smoothness (mosaicity) of a crystal, and the XRC full width at half maximum at the (10-10) plane is an index of the dislocation density (twist) in the group III nitride semiconductor. In the measurements, the undoped GaN layer produced in this Example had the full width at half maximum of 170 arcsec. at the (0002) plane and 350 arcsec. at the (10-10) plane.

[Formation of the N-Type Contact Layer]

Then, the n-type contact layer made of GaN was made by the MOCVD method using the same MOCVD device as that used to form the base layer 14a. The n-type contact layer was formed under the same conditions as those in the base layer 14a, except that Si was doped into the n-type contact layer, and the crystal was grown by flowing $SiH_4$ as a Si dopant material. Moreover, the MOCVD device used to form the n-type contact layer is a conventional MOCVD device.

The buffer layer 12 made of a single crystal GaN, the undoped GaN layer (the n-type base layer 14a), and the Si-doped GaN layer (the n-type contact layer 14b) which had a carrier concentration of $5 \times 10^{18}$ $cm^{-3}$, and a thickness of 2 μm, were formed on the substrate 11 which was made of sapphire and had a surface treated with the sputter cleaning, as explained above.

[Formation of the N-Type Clad Layer]

The n-type clad layer 14c was formed on the n-type contact layer of the sample prepared through the steps explained above by the MOCVD method, as explained below.

The temperature of the substrate including the n-type contact layer made of Si-doped GaN was decreased to 760° C. while flowing ammonia into the chamber of the MOCVD device and using nitrogen as a carrier gas.

During decreasing the temperature in the furnace, the supply amount of $SiH_4$ was determined. Specifically, the amount of $SiH_4$ was determined such that the electron concentration into the Si-doped layer be $4 \times 10^{18}$ $cm^{-3}$. The amount of ammonia was continuously supplied into the chamber at the same flow rate as that in rising the temperature of the substrate.

Then, while flowing ammonia into the chamber, TMI vapor and TEG vapor, which were generated using $SiH_4$ gas and babbling, was flowed into the reaction furnace. Thereby, a layer which was made of $Ga_{0.99}In_{0.01}N$, and had a thickness of 1.7 nm, and a layer which was made of GaN and had a thickness of 1.7 nm were formed respectively. After repeating this layer formation step 19 times, the layer which was made of $Ga_{0.99}In_{0.01}N$ and had a thickness of 1.7 nm was formed at the last time. Moreover, while the layer formation steps, $SiH_4$ was continuously flown. Thereby, the n-type clad layer 14c having a superlattice structure including Si-doped $Ga_{0.99}In_{0.01}N$ and GaN was produced.

[Formation of Light-Emitting Layer]

Then, the light-emitting layer 15, which had a multiple quantum well structure and included the barrier layers 15a made of GaN and the well layers 15b made of $Ga_{0.92}In_{0.08}N$, was formed. Specifically, first, the barrier layer 15a was formed on the n-type clad layer 14c made of Si-doped $In_{0.01}Ga_{0.99}N$. Then, the well layer 15b made of $Ga_{0.92}In_{0.08}N$ was formed on the barrier layer 15a. This layer formation step was repeatedly six times. Then, the seventh barrier layer 15a was formed on the sixth well layer 15b. Thereby, the barrier layer 15a was arranged to both sides of the light-emitting layer 15 having a multiple quantum well structure.

More specifically, while maintaining the temperature of the substrate to 760° C., TEG and $SiH_4$ were supplied into the reaction furnace. Thereby, the initial barrier layer which was made of GaN doped with Si and had a thickness of 0.8 nm, was formed. The supplying TEG and $SiH_4$ was stopped. Then, the temperature of the susceptor was raised to 920° C. After that, TEG and $SiH_4$ were started to supply into the reaction furnace again, an intermediate barrier layer having a thickness of 1.7 nm was grown while maintaining the temperature of the substrate at 920° C. Then, supplying TEG and $SiH_4$ into the reaction furnace was stopped. The temperature of the susceptor was lowered down to 760° C. After that, TEG and $SiH_4$ was started to supply into the reaction furnace again, a final barrier layer having a thickness of 3.5 nm was grown. Then, supplying TEG and $SiH_4$ was stopped again to stop growing the GaN barrier layer. The Si-doped GaN barrier layer (barrier layer 15a) which includes the initial barrier layer, the intermediate barrier layer, and the final barrier layer, and had a total thickness of 5 nm, was formed by these 3-step layer formation process. Moreover, the amount of $SiH_4$ was adjusted such that the Si concentration was $1\times10^{17}$ cm$^{-3}$.

After growth of the barrier layer 15 was stopped, while maintaining the temperature of the substrate 11, inner pressure of the reaction furnace, and the flow rate and the kind of the carrier gas, TEG and TMI was supplied into the reaction furnace to form the well layer made of $Ga_{0.92}In_{0.08}N$. Thereby, the well layer 15b having a thickness of 2 nm was formed.

After growth of the well layer 15b made of $Ga_{0.92}In_{0.08}N$, the supply rate of TEG was changed. Then, supply of TEG and $SiH_4$ was started to form the second barrier layer 15a.

These steps are repeatedly six times. Thereby, six Si-doped GaN barrier layers 105a and six $Ga_{0.92}In_{0.08}N$ well layers 105b were formed.

After the sixth well layer 15b made of $Ga_{0.92}In_{0.08}N$ was formed, the seventh barrier layer was continuously formed. In the process of forming the seventh barrier layer, first, supply of $SiH_4$ was stopped. Thereby, undoped GaN initial barrier layer was formed. After that, the temperature of the susceptor was raised to 920° C. while supplying TEG into the furnace, and the intermediate barrier layer was grown for a fixed time. Then, supplying TEG into the reaction furnace was stopped, and the temperature of the substrate was lowered down to 760° C. After that, TEG was started to supply into the reaction furnace again, a final barrier layer was grown. Then the supply of TEG was stopped to finish the growth of the final barrier layer. Thereby, the barrier layer (see the uppermost barrier layer 15a in the light-emitting layer 15 shown in FIGS. 1 and 2), which was made of undoped GaN, had three layers, that is, the initial barrier layer, the intermediate barrier layer, and the final barrier layer, and the total thickness of 4 nm, was formed.

Through these procedures, the light-emitting layer having the multiple quantum well structure, which included well layers (see the first through fifth well layers 15b from the side of the n-type semiconductor layer 14 in FIG. 3) having a nonuniform thickness and well layer (see the sixth well layer 15b from the side of the n-type semiconductor layer 14 in FIGS. 1 and 3) having a uniform thickness, was formed.

[Formation of the P-Type Semiconductor Layer]

After these steps explained above, the p-type clad layer 16a having the multiple quantum well structure, which included four layers made of undoped $Al_{0.06}Ga_{0.94}N$ and three layers made of Mg-doped GaN, using the same MOCVD device as that used in the formation of the light-emitting layer. Then, the p-type contact layer 16b made of Mg-doped GaN having a thickness of 200 nm was formed on the produced p-type clad layer 16a to produce the p-type semiconductor layer 16.

Specifically, first, the temperature of the substrate was raised to 975° C. while supplying $NH_3$ gas into the reaction furnace. Then the carrier gas was changed from nitrogen to hydrogen at this temperature. The temperature of the substrate was lowered down to 105° C. After that, a layer made of undoped $Al_{0.06}Ga_{0.94}N$ having a thickness of 2.5 nm by supplying TMG and TMA into the reaction furnace. Consequently, the valve of TMA was closed, and the valve of $Cp_2Mg$ was opened to form the GaN layer without intervals, which was doped with Mg and had a thickness of 2.5 nm.

These steps were repeated three times, and finally, a layer made of undoped $Al_{0.06}Ga_{0.94}N$ was formed. Thereby, the p-type clad layer 16a having the multiple quantum well structure was formed.

After that, the p-type contact layer 16b, which was made of p-type GaN and had a thickness of 200 nm, was formed by supplying only $Cp_2Mg$ and TMG.

Thereby, the p-type semiconductor layer 16a, which included the p-type clad layer 16a having a thickness of 15 nm and the p-type contact layer 16b which had a thickness of 20 nm and was made of Mg doped GaN, was finally obtained. Moreover, the p-type contact layer 16b had p-type properties without annealing for activating the p-type carrier.

In other words, the epitaxial wafer for LED which was formed by the steps explained above includes:

the substrate 11 made of sapphire and having the C-plane;

the GaN layer (buffer layer 12), which had a single crystal structure and a thickness of 40 nm, on the C-plane of the substrate; and the following layers formed on the buffer layer 12 in the following order from the substrate side, that is, the undoped GaN layer (base layer 14a) having a thickness of 6 μm; the n-type contact layer 14b having a thickness of 2 μm and an electron concentration of $5\times10^{18}$ cm$^{-3}$;

the n-type clad layer 14c having a superlattice structure with an electron concentration of $4\times10^{18}$ cm$^{-3}$, and including 20 layers each of which had a thickness of 1.7 nm, and was made of $Ga_{0.99}In_{0.01}N$, and nineteen layers each of which had a thickness of 1.7 nm, and was made of GaN;

a multiple quantum well structure (light-emitting layer 15), which included six Si-doped GaN barrier layers (barrier layers 15a) having a thickness of 5 nm, and one of them is the lowest layer in the multiple quantum well structure, and six undoped $Ga_{0.92}In_{0.08}N$ well layers (well layers 15b) having a thickness of 2 nm, and the final barrier layer (see the uppermost barrier layer 15a in the light-emitting layer 15 shown in FIGS. 1 and 3) made of undoped GaN; and the p-type clad layer 16a having a superlattice structure including four layers each of which had a thickness of 2.5 nm and was made of $Al_{0.06}Ga_{0.94}N$, and three layers each of which had a thickness of 2.5 nm and was made of Mg-doped GaN; and the p-type contact layer 16b which had a thickness of 20 nm and was made of Mg-doped GaN.

[Production of LED]

Subsequently, the light-emitting diode (the light-emitting device 1 in FIGS. 2 and 3), which is one of a semiconductor light-emitting device, was produced using the epitaxial wafer (laminate semiconductor 10).

Specifically, the transparent anode 17 made of ITO was formed by a well-known photo lithography method on the surface of the Mg-doped GaN layer (the p-type semiconductor layer 16b) of the epitaxial wafer. Then, the anode bonding pad 18 having the structure, in which titanium, aluminum, and gold are laminated in this order, was formed on the surface of the obtained transparent anode 17, in order to make a p-side electrode. In addition, a part of the wafer was dry-etched to form the exposed area 14d in the n-type contact layer 14 on which an e-side electrode (negative electrode) is formed. Then, the cathode 19 (n-side electrode), which includes layers made of Ni, Al, Ti, Au respectively, was also formed on the exposed area 14d. Thereby, electrodes shown in FIGS. 2 and 3 were produced on the wafer (the laminate semiconductor 10 shown in FIG. 1).

The back surface of the substrate of the wafer, which includes electrodes on both the p-type semiconductor layer and the n-type semiconductor layer, was ground and polished to make the surface like a mirror. Then, the wafer was cut into square chips in a size of 350 μm×350 μm. After that, the obtained chip was arranged on the lead frame such that both electrodes face upwardly, connecting to lead frames using metal wires to produce the semiconductor light-emitting device (lamp 3 shown in FIG. 5).

When a forward current was flowed between electrodes on the p-type semiconductor layer and the n-type semiconductor layer of the obtained device, the forward voltage in 20 mA of current was 3.0 V. When the light-emitting conditions were measured through the transparent anode 17 on the p-type semiconductor layer, a light-emitting wavelength was 450 nm and the light-emitting output power was 20 mW. These light-emitting properties were obtained in nearly the entire light-emitting diodes formed by the wafer without variation.

Comparative Example

In this Comparative Example, the comparative semiconductor light-emitting device was produced in a manner identical to those of Example 1, except that the buffer layer made of GaN was formed on the substrate without the pretreatment using sputter cleaning on the c-plane of the sapphire substrate, and the base layer 14a made of GaN was formed on the buffer layer by the MOCVD method.

In the semiconductor light-emitting device in Comparative Example, the forward voltage in 20 mA of current was 3.0 V, and the light-emitting wavelength was 470 nm. However, the light-emitting output power was 10 mW, and it was lower than that of Example 1.

In addition, when the X-ray rocking curve (XRC) of the base layer, which is made of GaN, was measured, the full width at half maximum at the (0002) plane and the (10-10) plane was 300 seconds and 500 seconds, respectively. From the results, it is clear that the crystallinity of the wafer in Comparative Example was inferior.

Experimental Example

Figure 10A:
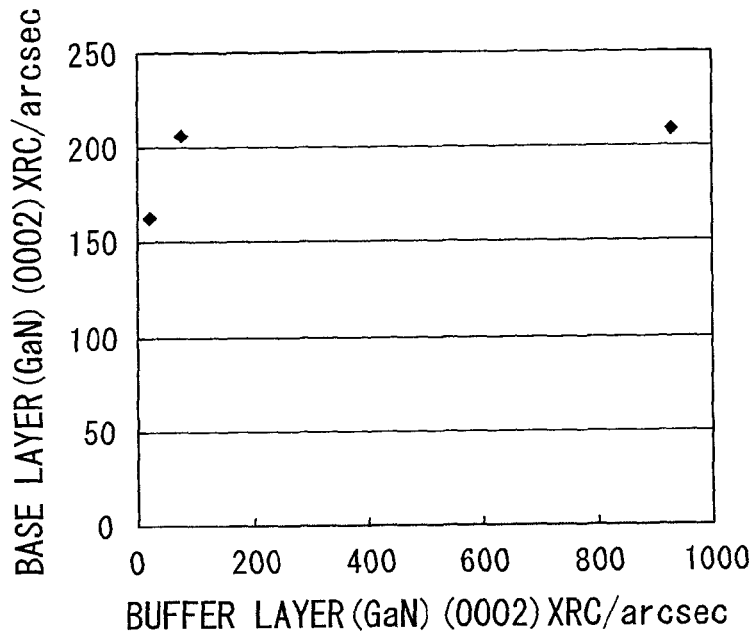
FIG. 10A is a graph explaining one example of the group III nitride semiconductor light-emitting device according to the present invention, and specifically a graph showing the relationship of a full width at half maximum of (0002) plane X-ray rocking curve between the buffer layer and the base layer.
Figure 10B:
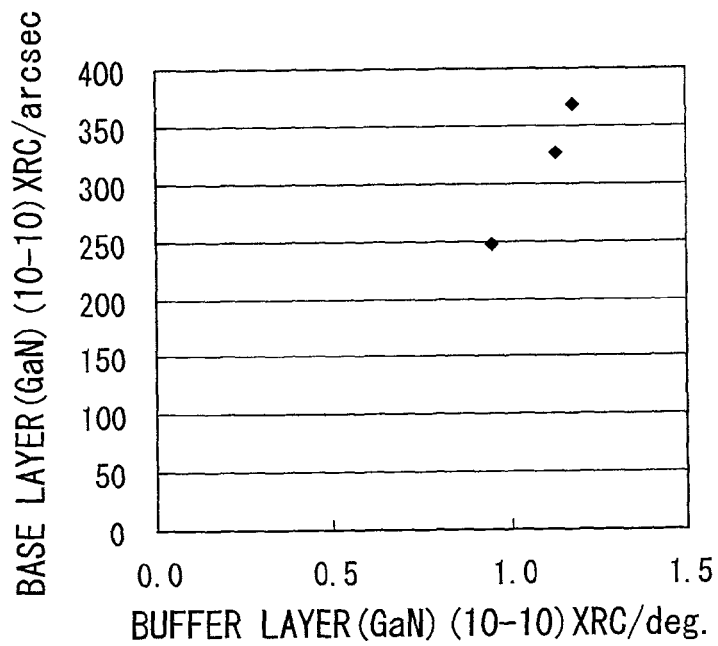
FIG. 10B is a graph explaining one example of the group III nitride semiconductor light-emitting device according to the present invention, and specifically a graph showing the relationship of a full width at half maximum of (10-10) plane X-ray rocking curve between the buffer layer and the base layer.

The experimental examples for demonstrating the present invention are explained referring to FIGS. 10A and 10B.

FIG. 10A is a graph showing the relationship of an X-ray rocking curve full width at half maximum at the (0002) plane between the buffer layer and the base layer. FIG. 10B is a graph showing the relationship of an X-ray rocking curve full width at half maximum at the (10-10) plane between the buffer layer and the base layer.

In this experimental example, samples numbered 1 through 3 were produced by forming the buffer layer made of GaN on the sapphire substrate, and forming the base layer made of GaN on the buffer layer in the same manner as in the Example 1, except that the layer formation time, and the temperature of the substrate while forming the buffer layer were changed.

Moreover, while the samples Nos. 1 through 3 were produced, after forming the buffer layer on the substrate, the X-ray rocking curve (XRC) at the (0002) plane and the (10-10) plane of the buffer layer was measured in the same manner as in the Example 1. In addition, after forming the base layer on the buffer layer, the X-ray rocking curve (XRC) at the (0002) plane and the (10-10) plane of the base layer was measured in the same manner as in the Example 1.

As shown in FIG. 10A, the XRC full width at half maximum at the (0002) plane of the base layer is constantly about 210 arcsec. when the XRC full width at half maximum of the (0002) plane of the buffer layer base layer is in a range of 80 to 900 arcsec. In addition, the XRC full width at half maximum at the (0002) plane of the base layer is 160 arcsec. when the XRC full width at half maximum at the (0002) plane of the buffer layer base layer is 20 arcsec. Thereby, it is confirmed that these layers have superior flatness.

As shown in FIG. 10B, the XRC full width at half maximum at the (10-10) plane of the buffer layer substantially relates to the XRC full width at half maximum at the (10-10) plane of the base layer. Specifically, when the XRC full width at half maximum at the (10-10) plane of the buffer layer is about 0.95°, the XRC full width at half maximum at the (10-10) plane of the base layer base layer is about 248 arcsec. Thereby, it is confirmed that these layers have superior crystallinity.

As shown in these experimental results, it is confirmed that the buffer layer, which was formed on the pretreated substrate according to the production method of the present invention, has superior flatness and crystallinity. In addition, it is also confirmed that the base layer formed on the buffer layer also has improved crystallinity. Thereby, each layer constituting the group III nitride semiconductor formed on the base layer also has improved crystallinity. Due to this fact, it is clear that the light-emitting device having excellent light-emitting properties can be obtained.

INDUSTRIAL APPLICABILITY

According to the method for producing a group III nitride semiconductor light-emitting device of present invention, it is possible to obtain the buffer layer having excellent uniformity and orientation. In addition, since a base layer having high crystallinity can be formed on the buffer layer, lattice mismatch does not occur between the substrate and the semiconductor layer made of the group III nitride semiconductor. Due to this, it is possible to grow the group III nitride semiconductor having high crystallinity on the substrate with high efficiency. It is also possible to produce the group III nitride semiconductor light-emitting device having excellent light-emitting properties with high productivity.

In addition, the layers, each of which is made of group III nitride semiconductor, are formed on the buffer layer, have high crystallinity in the group III nitride semiconductor light-emitting device of the present invention. Thereby, the group III nitride semiconductor light-emitting device according to the present invention has excellent light-emitting properties.

In addition, according to the lamp of the present invention, since the lamp of the present invention comprises the group III nitride compound semiconductor light-emitting device according to the present invention, the lamp has excellent light-emitting properties.

EXPLANATION OF REFERENCE SYMBOLS 1 and 2: group III nitride semiconductor light-emitting device (light-emitting device)
| | |
|---|---|
| 10: laminate semiconductor | 11 and 60: substrate |
| 11a and 61: surface of the substrate | 62: flat surface |
| 63: convex portion | 12 and 52: buffer layer |
| 14 and 54: n-type semiconductor layer | 14a and 54a: base layer |
| 15 and 55: light-emitting layer | |
| 16 and 56: p-type semiconductor layer | 20 and 70: semiconductor layer |
| 3: lamp | 40: layer formation device |
| 41: chamber | |

The invention claimed is:

1. A method for producing a group III nitride semiconductor light-emitting device comprising a substrate; a buffer layer made of a group III nitride which is laminated on the substrate; an n-type semiconductor layer comprising a base layer which is laminated on the buffer layer; a light-emitting layer which is laminated on the n-type semiconductor layer, and a p-type semiconductor layer which is laminated on the light-emitting layer, wherein the substrate is pretreated with plasma:

the buffer layer has a composition represented by $Al_xGa_{1-x}N$ ($0 \leq x < 0.5$) which is obtained as a single crystal by activating with plasma and reacting at least a metal gallium raw material and a gas containing a group V element;

the base layer is formed on the buffer layer; and the substrate has a main surface comprising a planar C plane and two or greater convex portions formed on the planar C plane, and the buffer layer covers the main surface of the substrate, the method comprising the steps of:

a pretreatment step in which the substrate is treated with plasma;

a buffer layer formation step in which the buffer layer having a composition represented by $Al_xGa_{1-x}N$ ($0 \leq x < 0.5$) is formed as a single crystal on the pretreated substrate by activating with plasma and reacting at least a metal gallium raw material and a gas containing a group V element; and a base layer formation step in which the base layer is formed on the buffer layer.

2. A method for producing a group III nitride semiconductor light-emitting device according to claim 1, wherein the base layer is formed by a metalorganic chemical vapor deposition method in the base layer formation step.

3. A method for producing a group III nitride semiconductor light-emitting device according to claim 1, wherein the pretreatment step is carried out by flowing a gas containing nitrogen into a chamber in a layer formation device.

4. A method for producing a group III nitride semiconductor light-emitting device according to claim 3, wherein the partial pressure of the gas containing nitrogen which is flowed into the chamber is in a range of from $1 \times 10^{-2}$ Pa to 10 Pa.

5. A method for producing a group III nitride semiconductor light-emitting device according to claim 1, wherein the pretreatment step is carried out in a chamber, and the pressure in the chamber is in a range of from 0.1 Pa to 5 Pa.

6. A method for producing a group III nitride semiconductor light-emitting device according to claim 1, wherein the time for the pretreatment step is in a range of from 30 seconds to 3,600 seconds.

7. A method for producing a group III nitride semiconductor light-emitting device according to claim 6, wherein the time for the pretreatment is in a range of from 60 seconds to 600 seconds.

8. A method for producing a group III nitride semiconductor light-emitting device according to claim 1, wherein the temperature of the substrate in the pretreatment step is in a range of from 25° C. to 1,000° C.

9. A method for producing a group III nitride semiconductor light-emitting device according to claim 8, wherein the temperature of the substrate in the pretreatment step is in a range of from 300° C. to 800° C.

10. A method for producing a group III nitride semiconductor light-emitting device according to claim 1, wherein the pretreatment step and the buffer layer formation step are carried out in the same chamber.

11. A method for producing a group III nitride semiconductor light-emitting device according to claim 1, wherein the plasma treatment in the pretreatment step is sputter cleaning.

12. A method for producing a group III nitride semiconductor light-emitting device according to claim 11, wherein the sputter cleaning is carried out by generating plasma using an electrical power supply having high frequency in the pretreatment step.

13. A method for producing a group III nitride semiconductor light-emitting device according to claim 12, wherein the sputter cleaning is carried out by generating nitrogen plasma using an electrical power supply having high frequency in the pretreatment step.

14. A method for producing a group III nitride semiconductor light-emitting device according to claim 1, wherein the method further comprises a substrate processing step in which irregularity is formed on the surface of the substrate before the pretreatment step.

15. A method for producing a group III nitride semiconductor light-emitting device according to claim 1, wherein the buffer layer is formed so as to cover at least 90% of a main surface of the substrate in the buffer layer formation step.

16. A method for producing a group III nitride semiconductor light-emitting device according to claim 1, wherein the buffer layer is formed by a reactive sputtering method in the buffer layer formation step.

17. A method for producing a group III nitride semiconductor light-emitting device according to claim 16, wherein the buffer layer is formed by a reactive sputtering method which flows a gas containing the group V element into a reactor in the buffer layer formation step.

18. A method for producing a group III nitride semiconductor light-emitting device according to claim 16, wherein the buffer layer is formed by an RF sputtering method in the buffer layer formation step.

19. A method for producing a group III nitride semiconductor light-emitting device according to claim 18, wherein the buffer layer is formed by an RF sputtering method while moving a cathode magnet in the buffer layer formation step.

20. A method for producing a group III nitride semiconductor light-emitting device according to claim 16, wherein the buffer layer is formed by a DC sputtering method in the buffer layer formation step.

21. A method for producing a group III nitride semiconductor light-emitting device according to claim 20, wherein the buffer layer is formed by a pulsed DC sputtering method in the buffer layer formation step.

22. A method for producing a group III nitride semiconductor light-emitting device according to claim 1, wherein the group V element used in the buffer layer formation step is nitrogen.

23. A method for producing a group III nitride semiconductor light-emitting device according to claim 1, wherein the gas containing the group V element used in the buffer layer formation step is ammonia.

24. A method for producing a group III nitride semiconductor light-emitting device according to claim 1, wherein the temperature of the substrate in the buffer layer formation step is in a range of room temperature to 1,000° C.

25. A method for producing a group III nitride semiconductor light-emitting device according to claim 24, wherein the temperature of the substrate in the buffer layer formation step is in a range of 200° C. to 800° C.

26. A method for producing a group III nitride semiconductor light-emitting device according to claim 1, wherein the temperature of the substrate in the base layer formation step is 900° C. or more.

27. A group III nitride semiconductor light-emitting device obtained by the method according to claim 1.

28. A group III nitride semiconductor light-emitting device comprising a substrate; a buffer layer made of a group III nitride which is laminated on the substrate; an n-type semiconductor layer comprising a base layer which is laminated on the buffer layer; a light-emitting layer which is laminated on the n-type semiconductor layer; and a p-type semiconductor layer which is laminated on the light-emitting layer, wherein the substrate is pretreated with plasma:

the buffer layer has a composition represented by $Al_xGa_{1-x}N$ ($0 \le x < 0.5$) which is obtained as a single crystal by activating with plasma and reacting at least a metal gallium raw material and a gas containing a group V element;

the base layer is formed on the buffer layer; and the substrate has a main surface comprising a planar C plane and two or greater convex portions formed on the planar C plane, and the buffer layer covers the main surface of the substrate.

29. A group III nitride semiconductor light-emitting device according to claim 28, wherein the base layer is a layer which is formed by a metalorganic chemical vapor deposition method on the buffer layer.

30. A group III nitride semiconductor light-emitting device according to claim 28, wherein the buffer layer is formed by a reactive sputtering method.

31. A group III nitride semiconductor light-emitting device according to claim 28, wherein the buffer layer is made of GaN.

32. A group III nitride semiconductor light-emitting device according to claim 28, wherein the substrate is made of sapphire.

33. A group III nitride semiconductor light-emitting device according to claim 28, wherein the buffer layer is formed so as to cover at least 90% of a main surface of the substrate.

34. A group III nitride semiconductor light-emitting device according to claim 28, wherein the thickness of the buffer layer is in a range of 10 to 500 nm.

35. A group III nitride semiconductor light-emitting device according to claim 28, wherein the thickness of the buffer layer is in a range of 20 to 100 nm.

36. A group III nitride semiconductor light-emitting device according to claim 28, wherein the base layer is made of a GaN-based compound semiconductor.

37. A group III nitride semiconductor light-emitting device according to claim 28, wherein the convex portion has a base width in a range of 0.05 to 5 μm, a height in a range of 0.05 to 5 μm, the height is ¼ or greater relative to the base width, and an interval between adjacent convex portions is 0.5 to 5 times the base width.

38. A group III nitride semiconductor light-emitting device according to claim 28, wherein the convex portion has a shape of which an external form becomes smaller toward a top of the convex portion.

39. A group III nitride semiconductor light-emitting device according to claim 28, wherein the convex portion has a substantially circular cone shape or a substantially polygonal pyramid shape.

40. A lamp comprising the group III nitride semiconductor light-emitting device according to claim 28.

* * * * *